United States Patent
Ide et al.

(10) Patent No.: US 7,772,911 B2
(45) Date of Patent: Aug. 10, 2010

(54) TIMING CONTROL CIRCUIT AND SEMICONDUCTOR STORAGE DEVICE

(75) Inventors: Akira Ide, Tokyo (JP); Yasuhiro Takai, Tokyo (JP); Tomonori Sekiguchi, Tama (JP); Riichiro Takemura, Los Angeles, CA (US); Satoru Akiyama, Sagamihara (JP); Hiroaki Nakaya, Kokubunji (JP)

(73) Assignee: Elpida Memory, Inc., Tokyo (JP)

( * ) Notice: Subject to any disclaimer, the term of this patent is extended or adjusted under 35 U.S.C. 154(b) by 72 days.

(21) Appl. No.: 12/208,978

(22) Filed: Sep. 11, 2008

(65) Prior Publication Data

US 2009/0102524 A1 Apr. 23, 2009

(30) Foreign Application Priority Data

Sep. 13, 2007 (JP) ............................. 2007-238013

(51) Int. Cl.
*G06F 1/04* (2006.01)
(52) U.S. Cl. ........................ 327/291; 327/261
(58) Field of Classification Search ........................ None
See application file for complete search history.

(56) References Cited

U.S. PATENT DOCUMENTS

| | | | | |
|---|---|---|---|---|
| 6,166,990 A | * | 12/2000 | Ooishi et al. | 365/233.11 |
| 6,491,634 B1 | * | 12/2002 | Leavitt et al. | 600/447 |
| 6,927,605 B2 | * | 8/2005 | Fetzer et al. | 327/101 |
| 7,099,232 B2 | * | 8/2006 | Kwak | 365/194 |
| 7,629,819 B2 | * | 12/2009 | Kwak et al. | 327/158 |

FOREIGN PATENT DOCUMENTS

| | | |
|---|---|---|
| JP | 2004-110490 A | 4/2004 |
| JP | 2006-186547 A | 7/2006 |

OTHER PUBLICATIONS

1997 Symposium on VLSI Circuits Digest of Technical Papers (pp. 107-108).

* cited by examiner

*Primary Examiner*—Cassandra Cox
(74) *Attorney, Agent, or Firm*—Sughrue Mion, PLLC

(57) ABSTRACT

Disclosed is a timing control circuit that receives a first clock having a period T1, a group of second clocks of L different phases spaced apart from each other at substantially equal intervals and selection signals m, n supplied thereto and generates a fine timing signal delayed from the rising edge of the first clock signal by a delay td of approximately $td = m \cdot T1 + n \cdot (T2/L)$. The timing control circuit includes a coarse delay circuit and a fine delay circuit. The coarse delay circuit includes a counter for counting a rising edge of the first clock signal after an activate signal is activated and generates a coarse timing signal whose amount of delay from the first clock signal is approximately $m \cdot T1$. The fine delay circuit comprises L-number of multiphase clock control delay circuits disposed in parallel, delays by $n \cdot T2/L$ the timing of sampling of the coarse timing signal by respective clocks of the group of L-phase second clocks, and takes the OR among the resulting delayed pulses to thereby produce the fine timing signal.

16 Claims, 18 Drawing Sheets

FIG. 1B  m=2、n=3、L=4

| n | FF1 | FF2 | FF3 | FF4 | FF5 | FF6 | FF7 | FF8 | FF9 | FF10 | FF11 | FF12 | MS |
|---|-----|-----|-----|-----|-----|-----|-----|-----|-----|------|------|------|-----|
| 1 | R90 | - | - | R180 | - | - | R270 | - | - | R0 | - | - | MS1 |
| 2 | R180 | - | - | R270 | - | - | R0 | - | - | R90 | - | - | MS1 |
| 3 | R270 | - | - | R0 | - | - | R90 | - | - | R180 | - | - | MS1 |
| 4 | R0 | - | - | R90 | - | - | R180 | - | - | R270 | - | - | MS1 |
| 5 | R270 | R90 | - | R0 | R180 | - | R90 | R270 | - | R180 | R0 | - | MS2 |
| 6 | R270 | R180 | - | R0 | R270 | - | R90 | R0 | - | R180 | R90 | - | MS2 |
| 7 | R270 | R270 | - | R0 | R0 | - | R90 | R90 | - | R180 | R180 | - | MS2 |
| 8 | R0 | R0 | - | R90 | R90 | - | R180 | R180 | - | R270 | R270 | - | MS2 |
| 9 | R270 | R180 | R90 | R0 | R270 | R180 | R90 | R0 | R270 | R180 | R90 | R0 | MS3 |
| 10 | R270 | R180 | R180 | R0 | R270 | R270 | R90 | R0 | R0 | R180 | R90 | R90 | MS3 |

- : don't care

BEST

WORST

TIMING CONTROL CIRCUIT AND SEMICONDUCTOR STORAGE DEVICE

REFERENCE TO RELATED APPLICATION

This application is based upon and claims the benefit of the priority of Japanese patent application No. 2007-238013, filed on Sep. 13, 2007, the disclosure of which is incorporated herein in its entirety by reference thereto.

FIELD OF THE INVENTION

This invention relates to a timing control circuit. More particularly, the invention relates to a timing control circuit and method suited for timing signal generation in a semiconductor storage device and to a semiconductor storage device having this timing control circuit.

BACKGROUND OF THE INVENTION

FIG. 16A is a diagram schematically illustrating a typical configuration of a logic LSI chip. In order to raise the throughput of data processing in a logic LSI chip (LOGIC) in FIG. 16A, a pipeline operation is performed in which the path from a data input (DIN) to a data output (DOUT) is divided into a plurality of logic circuit blocks (LGK) at flip-flops (FF) and the flip-flops (FF1, FF2, and FF3) are controlled by a clock (CK). In the logic LSI chip (LOGIC), it is possible to perform the division in such a manner that each of the logic circuit blocks (LGK) will have substantially the same delay. As a result, operating frequency can be raised by performing a pipeline operation using flip-flops (FF1, FF2, and FF3) controlled by the common clock as set forth above. In the pipeline operation, a flip-flop (FF) samples the output of the immediately preceding logic circuit block (LGK) in synchronization with the clock and provides the sampled value to the succeeding logic circuit block (LGK), and the operation performed by each logic circuit block (LGK) is carried out in one clock cycle.

FIG. 16B is a diagram useful in describing a typical configuration of a clock-synchronized synchronous DRAM (SDRAM). For the sake of simplicity in FIG. 16B, input-stage flip-flops that sample respective ones of a command (CMD) and an address (ADD) are represented by FF1, and a command decoder and an address decoder are represented by a decoder (DEC). In the synchronous DRAM (SDRAM) shown in FIG. 16B, flip-flops FF1 and FF4 of input and output stages, respectively, of the command and address are controlled by clock CK (the rising edge of the clock). Other flip-flops (e.g., FF2, FF3) in the chip are controlled by timing signals produced in a timing control circuit (TG) by generating pulses in a pulse generator (PG) from the clock (CK) that has entered from an external terminal and delaying the pulses by analog delay circuits (ADLY1, ADLY2).

In the synchronous DRAM, the delays of the decoder (DEC), a memory array (MEMCORE) and a data bus (DB), which are functional blocks within the chip, differ greatly from one another. If timing is controlled by the common clock, the clock frequency at which operation is possible is decided by the delay of the memory array. That is, in the synchronous DRAM, the delays of the function blocks cannot be made approximately the same, pipeline operation cannot be carried out using flip-flops (FF) controlled by the common clock and, as a result, it is difficult to raise the frequency, as in the logic LSI of FIG. 16A.

The operation of the synchronous DRAM illustrated in FIG. 16B will be described taking a read operation as an example. When a command (CMD) and address (ADD) are supplied to the synchronous DRAM, each of these is captured into the chip in synchronization with the clock (CK) by the corresponding input-stage flip-flop FF1. The command and address that have been captured in the flip-flop FF1 are decoded by the decoder (DEC), and the operation (read in this case) and the address to be selected are decided. A clock pulse from the pulse generator (PG) is supplied to the clock terminal CK of the next flip-flop FF2 upon being delayed by the analog delay (ADLY1) so as to match with this timing, and a main word line (MWLB) of the selected address is activated in the memory array (MEMCORE).

Next, the pulse that has been delayed by the analog delay (ADLY1) is supplied to the clock terminal CK of the flip-flop FF3 upon being further delayed by the analog delay (ADLY2) so as to match with the timing at which a signal is generated on a bit line (not shown) from a memory cell (not shown) selected in the memory array (MEMCORE), a sense-amplifier start-up signal (SAN) is activated and the generated signal is amplified by a sense amplifier (not shown).

When a read command is input in succession, the signal that has been amplified by the sense amplifier (not shown) is transmitted up to an output buffer through a data bus (DB) and is output from the external data output terminal (DOUT) of the chip in synchronization with the clock from a counter (COUNT).

Patent Document 1 describes an arrangement having a coarse adjustment circuit for coarsely adjusting clock phase and a fine adjustment circuit for finely adjusting clock phase. It should be noted that the invention described in Patent Document 1 has an arrangement that is completely different from that of the present invention, described later. Further, Patent Document 2 discloses a timing generating circuit having first and second DLLs (Delay Locked Loops) for supplying supply voltage to serially connected coarse and fine delay units, wherein delay units used as monitor circuits of the first and second DLLs have the same circuit configurations as those of the coarse and fine delay units, respectively.

[Patent Document 1] Japanese Patent Kokai Publication No. JP-P2004-110490A

[Patent Document 2] Japanese Patent Kokai Publication No. JP-P2006-186547A

[Non-Patent Document 1] Kohtaroh Gotoh, Shigetoshi Wakayama, Miyoshi Saito, Junji Ogawa, Hirotaka Tamura, Yoshinori Okajima and Masao Taguchi, "All-Digital Multi-Phase Delay Locked Loop for Internal Timing Generation in Embedded and/or High-Speed DRAMs", 1997 Symposium on VLSI Circuits Digest of Technical Papers (pp. 107-108)

SUMMARY

The entire disclosures in the above-mentioned Non-Patent Document and Patent Documents are incorporated herein by reference. The analysis below is given by the present invention.

Owing to progress in the micro-fabrication of MOS transistors and interconnections in LSI chips and in the use of lower voltages, variations in device characteristics have become a major problem in recent years.

FIG. 17A is a diagram illustrating an example of the circuit configuration of the above-mentioned analog delay (ADLY). As one example, FIG. 17A illustrates an arrangement in which multiple stages of inverters (INV) are connected in cascade.

FIG. 17B illustrates values of a delay amount (td), which are exhibited by the analog delay (ADLY) of FIG. 17A, obtained by a simulation under various conditions, the values being illustrated as relative values. "Low voltage" corresponds to a case where the operating voltage has a low degree of variation, and "high voltage" corresponds to a case where the operating voltage has a high degree of variation. "Slow" corresponds to a case where the threshold value of a MOS transistor is high, and "fast" corresponds to a case where the threshold value of the MOS transistor is low. "High temp" corresponds to a case where the operating temperature is high, and "low temp" corresponds to a case where the operating temperature is low.

In FIG. 17B and by way of example, a combination of "low voltage", "slow" and "high temp" corresponds to a delay in a case where the following holds:
  operating voltage exhibits a low degree of variation;
  threshold value of the MOS transistor is high; and
  operating temperature is high.

The delay amount (td) of the analog delay (ADLY) is large. Further, a combination of "high voltage", "fast" and "low temp" corresponds to a delay in a case where the following holds:
  operating voltage exhibits a high degree of variation;
  threshold value of the MOS transistor is low; and
  operating temperature is low.

The delay amount (td) of the analog delay (ADLY) is small. Other combinations are read in similar fashion.

As will be understood from FIG. 17B, there is an approximate two-fold difference between a case where delay is longest (maximum delay) and a case where delay is shortest (minimum delay) in the analog delay (ADLY). When the amount of delay thus varies greatly in the delay circuit within the synchronous DRAM, access time increases.

FIG. 18A is a diagram schematically illustrating operation timings of circuit blocks under a condition ("Best") where the circuitry internally of a synchronous DRAM operates at its fastest. In FIG. 18A, the operating times of a decoder (DEC), memory array (MEMCORE) and data bus (DB) are taken along the horizontal axis.

A delay amount td1 from a clock (CK) to a main word line (MWLB) and a delay amount td2 from the main word line (MWLB) to a sense-amplifier startup signal (SAN) are decided in such a manner that the operating times of these circuit blocks will not overlap, and the timing control circuit (TG) is provided with analog delays (ADLY1, ADLY2), as illustrated in FIG. 18B. In this case, the delay amount of the analog delay (ADLY1) is made td1, and the delay amount of the analog delay (ADLY2) is made td2.

FIG. 18B illustrates operation timings under a condition ("Worst") where the circuitry operates at its slowest in a case where the circuitry has been designed upon deciding the delay amounts in the manner described above.

The operating times of the circuit blocks, namely the decoder (DEC), memory array (MEMCORE) and data bus (DB), have increased in comparison with the operating times of the circuit blocks shown in FIG. 18A and, in addition, the delay amounts of the analog delays (ADLY1, ADLY2) also have increased. Since the amounts of increase in the delay amounts (td1, td2) of the analog delays (ADLY1, ADLY2) are greater than the amounts of increase in the respective operating times of the decoder (DEC) and memory array (MEMCORE), dead margins (DM1, DM2) arise between the end of operation of the decider (DEC) and the start of operation of the memory array (MEMCORE) and between the end of operation of the memory array (MEMCORE) and the start of operation of the data bus (DB), respectively. Owing to these timing margins, access time becomes longer than the sum of the delay amounts of the circuit blocks, namely decoder (DEC), memory array (MEMCORE) and data bus (DB). As a consequence, a problem which arises is that the original performance of the device and circuits cannot be exploited.

On the other hand, if the delay amounts of the analog delays (ADLY1, ADLY2) of FIG. 16B are decided without providing timing margins under the worst condition illustrated in FIG. 16B, then, in the case of the best condition shown in FIG. 18A, a succeeding circuit block will start operating before the operation of the preceding circuit block ends [i.e., the delay amounts td1, td2 will be shorter than the operating times of the decoder (DEC) and memory array (MEMCORE)]. As a consequence, operation of one circuit block will overlap operation of another circuit block and malfunction will occur.

An example in which a digital delay element (circuit) is applied to a memory circuit in order to solve this problem has been reported. The digital delay element (circuit) generally refers to a circuit that uses a clock signal and multiphase clock and generates delays that are whole-number multiples of the periods of the clock signal and multiphase clock. If a digital delay element (circuit) is used, a delay decided by an externally supplied clock period can be generated even in a case where device, temperature and supply voltage vary. This is advantageous in that the amount of fluctuation in delay amount is small. As one example, Non-Patent Document 1 discloses a DRAM in which a multiphase clock is generated by a DLL (Delay Lock Loop) and the multiphase clock is used internally.

However, the DLL requires a prescribed length of time (e.g., on the order of 100 cycles) from supply of the clock until the delay within the DLL becomes synchronized to the clock. Consequently, the clock cannot be halted even in a standby mode in which the DRAM is not operating, and the problem that arises is an increase in current consumption in the standby mode.

In accordance with the present invention, there is provided a timing control circuit having a digital delay circuit that receives a first clock signal having a first period, a group of second clocks having a second period with phases spaced apart from each other at prescribed intervals, an activate signal and a selection signal for setting a delay amount, for generating a signal delayed by a prescribed multiple of the first period based upon the selection signal, with an effective edge of the first clock at the time when the activate signal is activated serving as a reference, adding a delay, based upon the selection signal and which is a prescribed multiple of a length of time corresponding to the phase interval between adjacent clocks of the group of second clocks, onto a plurality of signals obtained by sampling the signal, which has been delayed by the prescribed multiple of the first period, in response to each of the second clocks of the group of second clocks, and generating a timing signal based upon the plurality of signals to which the delay has been added.

In the present invention, if the first period is T1, the second period is T2, the group of second clocks are L-phase clocks for which the phase between adjacent clocks is T2/L (where L represents a prescribed positive integer), values specified by the selection signal are non-zero integers m and n, and td represents delay time of the timing signal, then td is made a value obtained by adding fixed delay amounts, which are independent of T1 and T2, to $m \cdot T1 + n \cdot (T2/L)$, which is the sum of a delay time $m \cdot T1$, namely m times T1, and a delay time $n \cdot (T2/L)$, namely n times $(T2/L)$.

In the present invention, the digital delay circuit includes a coarse delay circuit for outputting a coarse timing signal delayed by $m \cdot T1$ from the effective edge of the first clock signal at the time when the activate signal is activated, where the first period is T1, the second period is T2, the group of second clocks are L-phase clocks for which the phase between adjacent clocks is T2/L (where L represents a prescribed positive integer) and values specified by the selection signal are non-zero integers m and n; and a fine delay circuit having: means for sampling the coarse timing signal in response to the group of second clocks; means for adding the delay n·(T2/L) onto each of the plurality of signals sampled; and means for outputting a fine timing signal at a timing delayed by n·(T2/L) from an effective edge of the coarse timing signal, based upon result of a logical operation performed on the plurality of signals to which the delay has been added. In the present invention, it may be so arranged that the integers m, n are recorded in a register so as to be capable of being varied freely.

In accordance with the present invention, there is also provided a timing control circuit comprising: a coarse delay circuit that receives a first clock signal having a first period (=T1), an activate signal and a selection signal (value=m) from a coarse-adjustment register, for outputting a coarse timing signal with a delay amount m·T1 from an effective edge of the first clock signal at the time when the activate signal is activated; and a fine delay circuit that receives a group of second clocks comprising L-phase clocks having a second period (=T2) with phases spaced apart from each other by T2/L (where L represents a prescribed integer equal to or greater than 2), the coarse timing signal that is output from the coarse delay circuit, and a selection signal (value=n) from a coarse-adjustment register, for adding a delay n·(T2/L) onto each of a plurality of signals obtained by sampling the coarse timing signal at the timings of the group of second clocks, and outputting a fine timing signal at a timing delayed by n·(T2/L) from an effective edge of the coarse timing signal, based upon result of a logical operation performed on the plurality of signals to which the delay has been added.

In the present invention, the coarse delay circuit includes: a shift register for transferring a fixed value successively in response to a shift clock that is input thereto; and a gate circuit, to which the first clock signal and the activate signal are input, for transmitting and outputting the first clock signal when the activate signal is in an activated state and masking the first clock when the activate signal is in a deactivated state; wherein a clock that is output from the gate circuit is used as a shift clock. The coarse delay circuit further includes a plurality of switches provided in correspondence with the number of selection signals from the coarse-adjustment register and having input ends to which the clock from the gate circuit is input in common and output ends connected in common with a single node. From among the plurality of switches, switches selected in correspondence with the value m of the selection signal are turned on, based upon the output of the shift register, at the moment the fixed value has been shifted to an mth stage of the shift register, the mth stage corresponding to the selection signal; and m cycles (where m has been selected by the selection signal) after the effective edge of the first clock signal at the time when the activate signal is activated, the clock that is output from the gate circuit is transmitted to the node and the coarse timing signal is output.

In the present invention, it may be so arranged that the coarse delay circuit has a circuit which, when the selection signal has been activated, is for setting a switch corresponding to the selection signal from the OFF to the ON state, based upon the output of the shift register, at the moment the fixed value has been shifted up to an mth stage of the shift register that corresponds to value m of the selection signal, and setting the switch from the ON to the OFF state at the moment the fixed value is shifted to an (m+1)th stage in the shift register, and when the selection signal is in a deactivated state, for turning the switch OFF.

In the present invention, it may be so arranged that the coarse delay circuit has a buffer circuit for buffering the signal at the node to which the output ends of the plurality of switches are connected in common and outputting the coarse timing signal, wherein the buffer circuit has an inverting circuit to which the signal at the node is input, and a switch which, when the output of the inverting circuit is a first logic value, connects the node to a terminal having a potential corresponding to a second logic value. In the present invention, it may be so arranged that a clock that is the inverse of the clock that is output from the gate circuit is used as the shift clock in the shift register of the coarse delay circuit.

In the present invention, the fine delay circuit includes: a plurality of flip-flops having data terminals, to which the coarse timing signal from the coarse delay circuit is input, for sampling and outputting the coarse timing signal in response to each of the second clocks of the group of second clocks; a plurality of multiphase clock control delay circuits to which respective ones of outputs of the plurality of flip-flops are input for outputting these upon delaying them by n·(T2/L), with transition timings of clocks supplied to clock terminals of the corresponding flip-flops serving as a reference; and a delay calculating circuit for receiving the value n of the selection signal and generating a signal for producing a delay that is n times (T2/L) in each of the plurality of multiphase clock control delay circuits; wherein the logical sum of outputs of the plurality of multiphase clock control delay circuits is taken and the fine timing signal delayed by n·(T2/L) from the coarse timing signal is output.

In the present invention, each multiphase clock control delay circuit includes: plural stages of cascade-connected flip-flops an initial stage of which receives the output of the flip-flop that corresponds to this multiphase clock control delay circuit; selectors of a first group, which are provided in correspondence with respective ones of the flip-flops of the plurality of stages, to which the group of second clocks is input for selecting, based upon a clock-input selection signal from the delay calculating circuit, clocks that are supplied to clock input terminals of the corresponding flip-flops; and a second selector, to which outputs of the flip-flops of the plurality of stages are input, for selecting and outputting one output based upon a node selection signal from the delay calculating circuit; wherein values of the clock-input selection signal in the selectors of the first group and of the node selection signal in the second selector are decided in the delay calculating circuit in such a manner that n·(T2/L) will be the delay from a timing that corresponds to a transition of the clock supplied to the flip-flop whose output is connected to the input of this multiphase clock delay circuit, until the selection is made by the second selector.

In accordance with the present invention, there is provided a semiconductor storage device having the above-described timing control circuit for controlling timing internally of a chip. The semiconductor storage device is a DRAM, and it may be so arranged that timing generated by the timing control circuit is used for at least one among bit-line de-equalization, word-line activation, sense-amplifier activation, column-select line activation and main-amplifier activation.

In accordance with the present invention, a timing control circuit having a digital delay element capable of being started up in a short period of time can be provided.

In accordance with the present invention, it is possible to provide a timing control circuit for generating timing having little delay fluctuation with respect to variations in process and operating environment, etc., eliminating dead margins and shortening access time. In accordance with the present invention, a desired fine timing signal can be obtained irrespective of the phase relationship between the first and second clocks.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

FIGS. 1A and 1B are diagrams illustrating the configuration and operation waveforms, respectively, of a timing control circuit (TG) according to an exemplary embodiment of the present invention;

PREFERRED MODES OF THE INVENTION

Figure 1A:
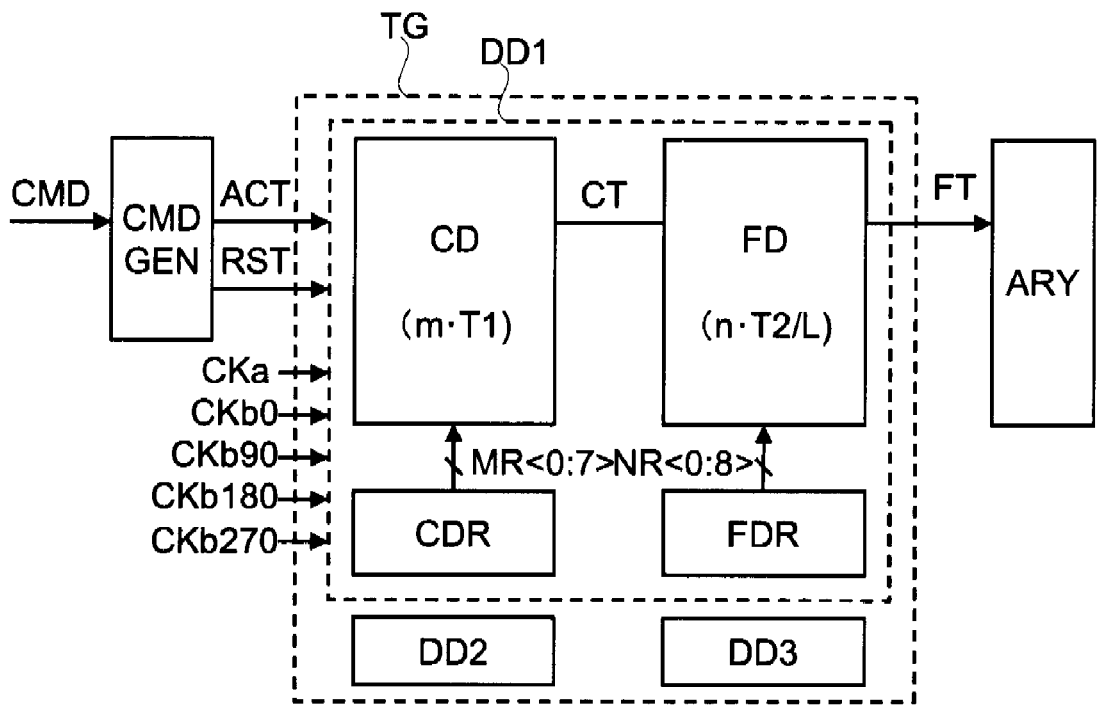

The modes of practicing the present invention will be described in detail with reference to the drawings. It should be noted that, in principle, identical members are identified by identical reference characters and will not be described repetitively in all of the drawings for describing the mode of the invention. Further, arrow symbols are appended to the gates of PMOS transistors in the drawings to distinguish these transistors from NMOS transistors. In addition, although the connections of substrate potentials of MOS transistors are shown, the method of connection is not particularly limited so long as the MOS transistors are capable of operating normally.

In the timing control circuit according to the present invention, the inputs are a first clock signal having a first period T1 and a group of second clocks having a second period T2 and constituting clocks of L phases (i.e., L-number of clock signals that differ in phase from each other by approximately T2/L). When values of a selection signal for selecting a delay are m, n (where m and n are non-negative integers), the timing control circuit generates a timing signal (a fine timing signal FT) such that an amount td of delay from the first clock will be approximately td=m·T1+n·(T2/L).

The timing control circuit according to the present invention includes a coarse delay circuit CD and a fine delay circuit FD. The coarse delay circuit CD has a counter for counting effective edges (e.g., rising edges) of the first clock signal after an activate signal ACT is activated. At the moment m clock cycles have been counted, the coarse delay circuit CD generates a coarse timing signal CT the amount of delay whereof from the effective edge of the first clock signal is approximately m·T1.

The fine delay circuit FD includes a plurality of multiphase clock control delay circuits PD1 to PD4 that receive as inputs the group of second clocks having the second period and comprising the L-phase clocks with phases spaced away from each other by (the second period)/L (where L is a prescribed integer equal to or greater than 2), the coarse timing signal that is output from the coarse delay circuit and a selection signal (value=n) from a fine-adjustment register, for sampling the coarse timing signal at each of a plurality of flip-flops at timings of the group of second clocks and generating signals obtained by adding the delay n·[(the second period)/L] onto the plurality of signals sampled at respective ones of the plurality of flip-flops. The fine delay circuit combines (e.g., takes the logical sum of) the signals obtained by adding on the delay at each of the plurality of multiphase clock control delay circuits and outputs a fine timing signal delayed by n·(T2/L) from the effective edge of the coarse timing signal. Exemplary embodiments will now be described.

FIG. 1A is a diagram illustrating the configuration of the timing control circuit TG according to an exemplary embodiment of the present invention, and FIG. 1B is a diagram illustrating operation waveforms of the timing control circuit TG according to the embodiment.

With reference to FIG. 1A, the inputs to the timing control circuit TG of this exemplary embodiment are a clock A (CKa) (which corresponds to the first clock signal in the present invention) the clock period of which is T1, and clocks B (CKb) the period whereof is T2. The clocks B (CKb) are L-phase clock signals (which correspond to the group of second clock signals in the present invention) whose phases are spaced apart by 360°/L. The L-phase clock signals are such that their rising edges are equally spaced at a time difference of T2/L. Although there is no particular limitation imposed on the present invention, in this exemplary embodiment, L is set to 4 and the clocks B (CKb) are made 4-phase clocks CKb0, CKb90, CKb180 and CKb270 whose phases are spaced apart from each other by 90°.

A command CMD is input to a command generator CMD-GEN within a memory chip, and the activate signal ACT and a reset signal RST generated by the command generator CMDGEN are supplied to the timing control circuit TG.

The timing control circuit TG has a plurality of digital delay circuits DD1, DD2 and DD3. Fine timing signals FT generated by respective ones of the plurality of digital delay circuits DD1, DD2 and DD3 are supplied to memory arrays ARY. It should be noted that for the sake of simplicity, FIG. 1A illustrates an arrangement in which the fine timing signal FT generated by the digital delay circuit DD1 is supplied to the memory array ARY. Fine timing signals FT generated by the digital delay circuits DD2, DD3 and memory arrays ARY to which the fine timing signals FT generated by the respective digital delay circuits DD2 and DD3 are input are not shown.

The fine timing signal FT has a rising edge delayed by the following delay time:

$$m \cdot T1 + n \cdot T2/L \quad (1)$$

from the rising edge (effective edge) of the clock A (CKa) when the activate signal ACT is active, with m and n being non negative integers.

In the actual circuit, fixed delays (delays produced independently of the clock period) tc+tf of the portions through which the clock signal passes within the circuit are added on.

It should be noted that the effective edge of the clock A (CKa) is described in this exemplary embodiment as being the rising edge, although it goes without saying the invention is not limited to such an arrangement. For example, it is of course permissible to adopt an arrangement in which, e.g., the falling edge of the clock A (CKa) is adopted as the effective edge and the timing control signal generates a fine timing signal FT having a falling edge delayed by $m \cdot T1 + n \cdot T2/L$ from the falling edge of the clock A (CKa).

The digital delay circuits DD1, DD2 and DD3 are identically constructed. In FIG. 1A, only the internal configuration of the digital delay circuit DD1 is illustrated.

As shown in FIG. 1A, the digital delay circuit DD1 includes the coarse delay circuit CD, the fine delay circuit FD, a coarse delay register CDR and a fine delay register FDR. It goes without saying that instead of providing the coarse delay register CDR and fine delay register FDR in each of the digital delay circuits DD1, DD2 and DD3 individually, it may be so arranged that these are provided as a register group (register file) in common for the digital delay circuits DD1, DD2, and DD3.

The clock A (CKa) is supplied to the coarse delay circuit CD. With the activate signal ACT in the activated state, the coarse delay circuit CD generates the coarse timing signal CT delayed from the rising edge of the clock A (CKa) by the following:

$$m \cdot T1 + tc \quad (2)$$

Here tc is a delay time specific to the coarse delay circuit CD. The value of m is transmitted to the coarse delay circuit CD from the coarse delay register CDR.

FIG. 1B illustrates a case where m=2 holds (MR<2> from the coarse delay register CDR of FIG. 1A is high). The coarse delay circuit CD outputs the coarse timing signal CT delayed by $2 \cdot T1 + tc$ from the rising edge of clock A (CKa) in a state in which the activate signal ACT has been activated (namely from the start of cycle 0 in FIG. 1B).

The clocks B (CKb0, CKb90, CKb180 and CKb270) are supplied to the fine delay circuit FD, which proceeds to generate the fine timing signal FT delayed from the rising edge of the coarse timing signal CT by the following:

$$n \cdot T2/L + tf \quad (3)$$

where tf is a delay time specific to the fine delay circuit FD. The value of n is transmitted to the fine delay circuit FD from the fine delay register FDR. FIG. 1B illustrates a case where n =3 holds (NR<3> from the fine delay register FDR of FIG. 1A is high).

The delay time td from the rising edge of clock A (CKa) to the rising edge of the fine timing signal FT in the state in which the activate signal ACT has been activated is represented by the following:

$$td = 2 \cdot T1 + 3 \cdot T2/L + tc + tf \quad (4)$$

In view of Equation (4), the delay time td increases by T1 whenever the value of m is incremented by one and increases by T2/L whenever the value of n is incremented by one.

When the timing control circuit of this exemplary embodiment is used, the fine timing signal FT is decided by T1, T2, L, m and n, and therefore a characterizing feature is that the circuit is not readily susceptible to fluctuations ascribable to temperature changes or variations in supply voltage and differences among devices. Only the fixed delay tc+tf, which is small in comparison with the overall delay, is influenced by temperature changes or variations in supply voltage and differences among devices. This means that the proportion of the amount of fluctuation in delay with respect to the overall delay can be greatly reduced.

Figure 1A:
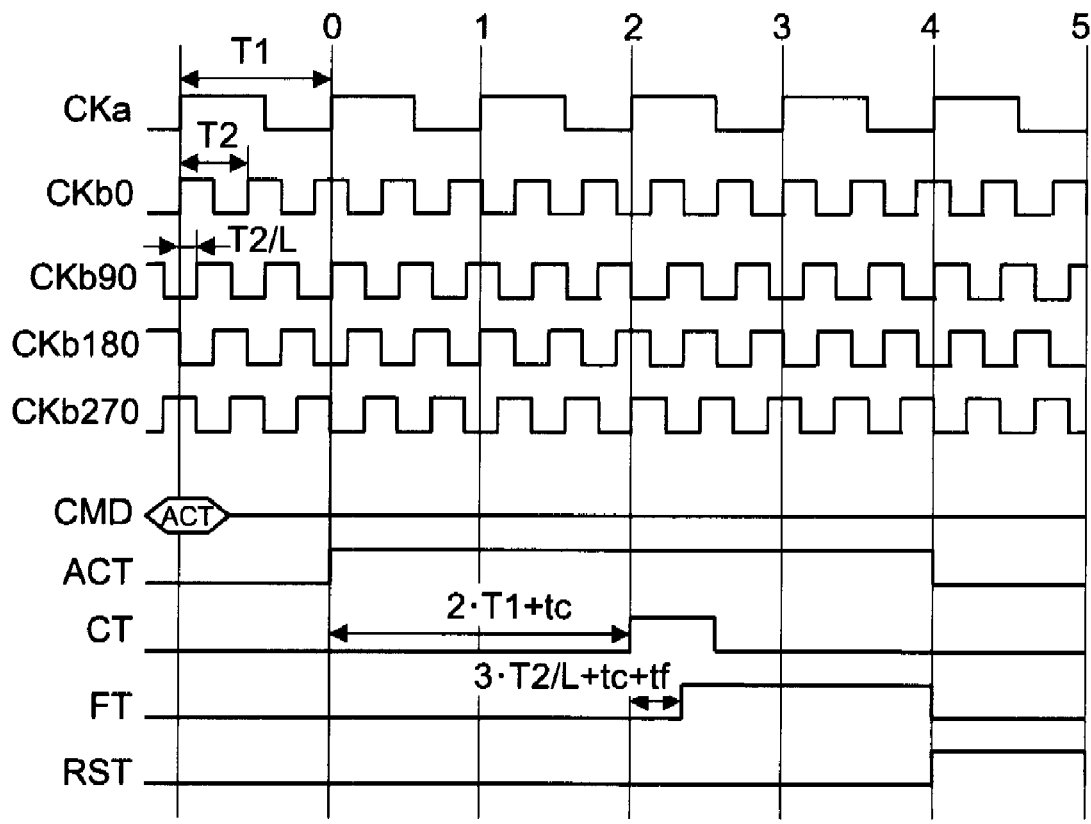
Figure 2:
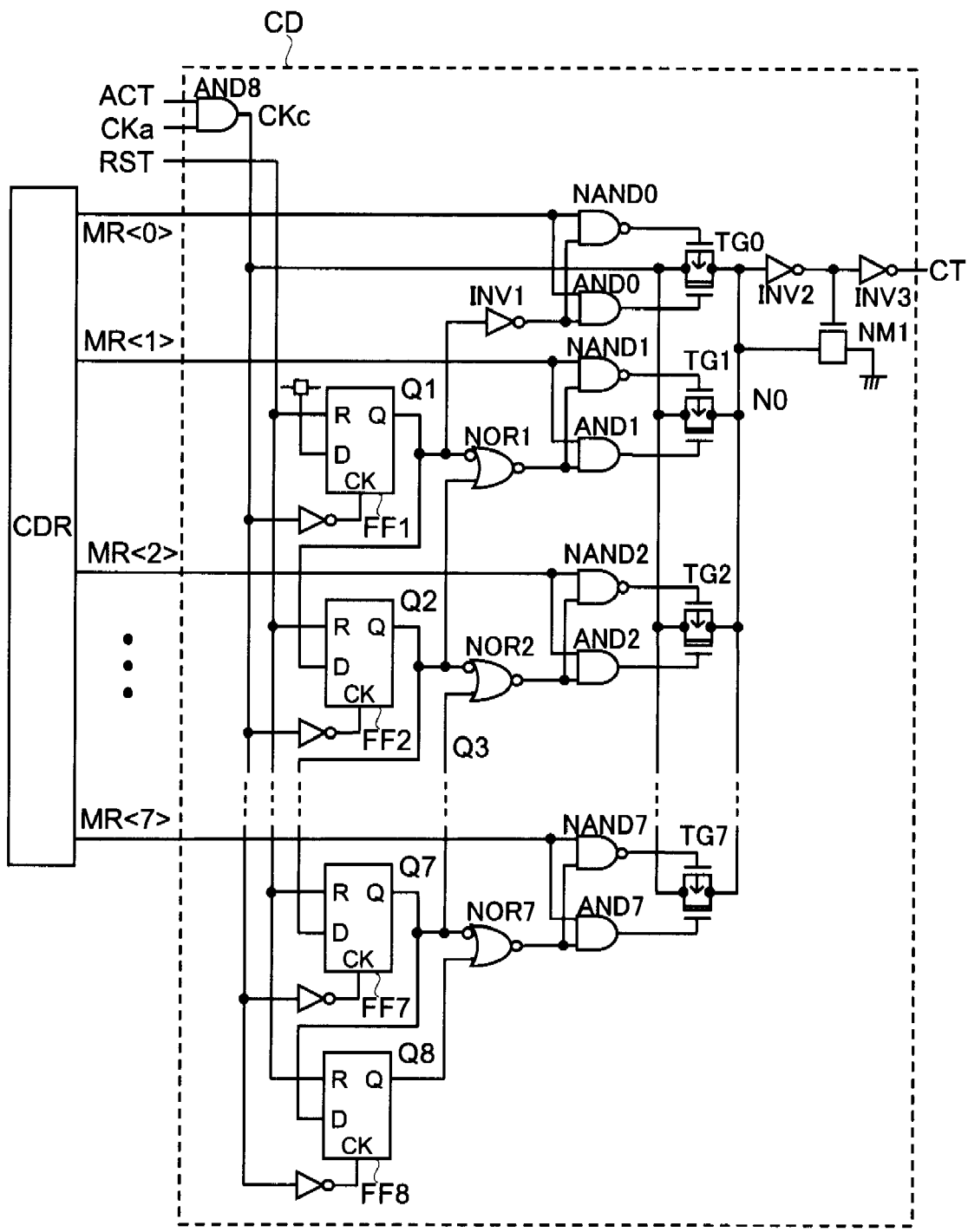
FIG. 2 is a diagram illustrating the circuit configuration of coarse delay circuit (CD) in the timing control circuit (TG) of FIG. 1A.

FIG. 2 is a diagram illustrating an example of the circuit configuration of the coarse delay circuit CD in FIG. 1. As shown in FIG. 2, the coarse delay circuit CD has a shift register (which functions as a counter for counting the clock) comprising a plurality of cascade-connected flip-flops (FF1 to FF8). By selecting a CMOS transfer gate (TG0, TG1, . . . , and TG7), which is turned on, based upon an m-selection signal MR<0:7> from the coarse delay register CDR and the output of the applicable stage of the shift register, the coarse delay circuit CD generates the coarse timing signal CT that is the result of delaying the clock A (CKa) by m cycles.

An AND gate AND8 receives the activate signal ACT and clock CKa as inputs, transmits the clock CKa and outputs it as a clock CKc when the activate signal ACT is in the activated state (high), and outputs a fixed value (low) (masks the clock) when the activate signal ACT is in the deactivated state (low).

The plurality of transfer gates (TG0, TG1, . . . , and TG7) receive the clock CKa as a common input and have their outputs connected in common with a node N0. The node N0 is connected to CT via an inverter INV2 and an inverter (inverting buffer) INV3.

With regard to control of transfer gate TG0 corresponding to the activated MR<0> in the m-selection signal, the gate is turned on selectively and outputs CKc as the coarse timing signal CT when output Q1 of flip-flop FF1 in the next stage is low. When output Q1 of flip-flop FF1 goes high in the next clock cycle, gate TG0 is turned off and, as a result, outputs a one-shot pulse as the coarse timing signal CT.

Further, with regard to control of transfer gate TGi corresponding to the activated MR<i> (where i is 0 to 7) in the m-selection signal, the gate is turned on selectively and outputs CKc as the coarse timing signal CT when output Qi of the flip-flop FFi of the corresponding stage is high and, moreover, output Qi+1 of flip-flop FFi+1 of the next stage is low. When output Qi of flip-flop FFi of the corresponding stage goes high and, moreover, output Qi+1 of flip-flop FFi+1 of the next stage goes high in the next clock cycle, gate TGi is turned off and, as a result, outputs a one-shot pulse as the coarse timing signal CT. It should be noted that an NMOS transistor NM1 having a gate that receives the output of the inverter INV2, a source connected to ground and a drain connected to the node N0 is turned on when the output of the inverter INV2 is high, thereby discharging the node N0 and establishing ground potential at the node.

More specifically, the output of NAND gate NAND0 to which are input MR<0> in the m-selection signal MR<0:7> and the output of the inverter INV1 that inverts the output Q1 of flip-flop FF1, and the output of AND gate AND0 to which are input the output of inverter INV1 and MR<0>, are connected to gates of the PMOS transistor and NMOS transistor, respectively, of transfer gate TG0. If, when the activate signal ACT and MR<0> are in the activated state (high), the output Q1 of flip-flop FF1 is low, then the outputs of NAND0 and AND0 go low and high, respectively, and gate TG0 turns on. If, when the activate signal ACT and MR<0> are in the activated state (high), the output Q1 of flip-flop FF1 goes high, then the outputs of NAND0 and AND0 go high and low, respectively, and gate TG0 turns off. That is, at cycle 0 (the falling edge of clock CKc is pulse zero), which is the moment the activate signal ACT is activated, transfer gate TG0 turns on, clock CKc is output to node N0 and is output to CT via the buffers (INV2, INV3).

A data input terminal D of the first flip-flop FF1 is connected to a power supply VDD, a signal that is the result of inverting clock CKc by an inverter is supplied to a clock terminal CK of the flip-flop FF1, and output Q1 of the flip-flop FF1 is connected to a data input terminal D of flip-flop FF2 of the next stage and is applied to an inverting input of a NOR gate NOR1. Output Q1 of flip-flop FF1 is supplied to AND gate AND0 via inverter INV1, as mentioned above. Output Q2 of flip-flop FF2 of the next stage is supplied to the other input of NOR gate NOR1, and the output of NOR gate NOR1 is supplied to AND gate AND1. Accordingly, NOR gate NOR1 outputs the high level when output Q1 of flip-flop FF1 is high and output Q2 of flip-flop FF2 is low, and outputs the low level otherwise. The output of NAND gate NAND1 to which MR<1> and the output of NOR gate NOR1 are input and the output of AND gate AND1 to which the output of NOR gate NOR1 and MR<1> are input are connected to the gates of the PMOS transistor and NMOS transistor of transfer gate TG1.

If, as a result of flip-flop FF1 sampling the power-supply potential at the falling edge of clock CKc when the activate signal ACT and MR<1> are in the activated state (high), the output Q1 is high and the output Q2 of flip-flop FF2 is low (namely a state in which the power-supply potential has not been shifted as far as flip-flop FF2), then the output of NOR gate NOR1 goes high, the outputs of NAND gate NAND1 and AND gate AND1 go low and high, respectively, and transfer gate TG1 turns on. If, when the activate signal ACT and MR<1> are in the activated state (high), output Q1 of flip-flop FF1 and output Q2 of flip-flop FF2 both go high (i.e., if the power-supply potential is shifted as far as flip-flop FF2), then the output of NOR gate NOR1 goes low at this time, the outputs of NAND gate NAND1 and AND gate AND1 go high and low, respectively, and transfer gate TG1 turns off. That is, from the moment the activate signal ACT is activated, the transfer gate TG1 turns on in response to the falling edge of the first pulse of clock CKc, clock CKa is output to node N0 and is output to CT via the buffers (INV2, INV3). When transfer gate TG1 turns on, node N0 is discharged to the ground terminal via NMOS transistor NM1 in response to clock CKa transitioning from high to low. The transfer gate TG1 then turns off in response to the falling edge of the second pulse of clock CKc.

A similar arrangement holds for the flip-flops FF2 to FF7 of the succeeding stages. It should be noted that the output of flip-flop FF8 is supplied to NOR gate NOR7, which corresponds to the flip-flop FF7 of the preceding stage. The flip-flops FF1 to FF8 have the reset signal RST connected in common with their reset terminals (R). When the reset signal RST is high, the output terminals Q1 to Q8 of these flip-flops are reset to the low level. The flip-flop FF1 samples and outputs the high potential (power-supply potential) in response to the falling edge of the first pulse of clock CKc. The flip-flops FF2 to FF7 sample and output the high potential that is output from the flip-flops FF1 to FF6 of the preceding stages in response to the falling edges of the second to seventh pulses, respectively, of clock CKc. The flip-flop FF8 samples and outputs the high potential that is output from the flip-flop FF7 in response to the falling edge of the seventh pulse of clock CKc.

Figure 3:
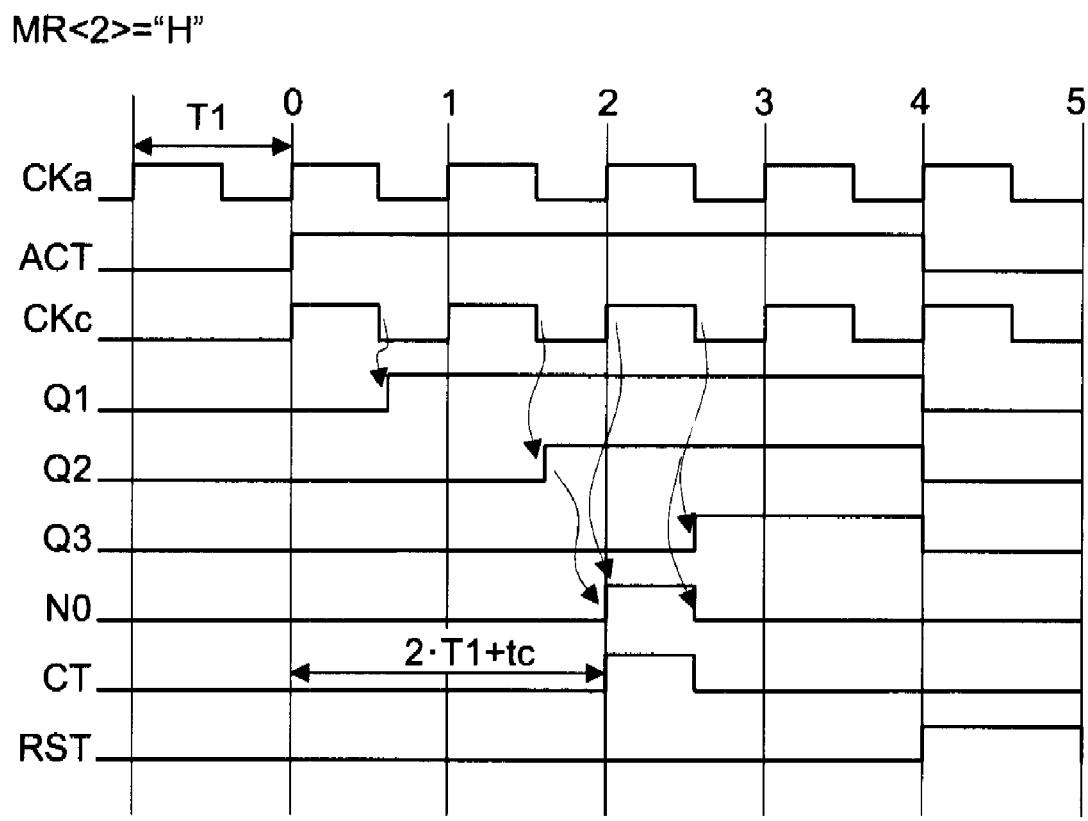
FIG. 3 is a diagram illustrating the operation waveforms of the coarse delay circuit (CD) in FIG. 2.

FIG. 3 is a timing chart useful in describing operation of the coarse delay circuit CD of FIG. 2. The result of taking the AND between clock A (CKa) and the activate signal ACT (using AND gate AND8 in FIG. 2) is clock CKc, and clock CKc is input as a shift clock to the shift register comprising the flip-flops FF1 to FF8. Since a signal obtained by inverting clock CKc is supplied to the clock terminals of the shift register, the high potential is transferred one clock cycle at a time to Q1 to Q7 at the falling edges of the signal. In FIG. 3, Q1 to Q4 attain the high potential successively in response to the falling edges of clock CKc in clock cycles 0 to 3 subsequent to the activate signal ACT going high, the reset signal RST is set to the high level and outputs Q1 to Q8 of flip-flops FF1 to FF8 are reset to the low level in clock cycle 4.

After the activate signal ACT is activated, output terminal Q2 of flip-flop FF2 transitions from low to high at the falling edge (the second falling edge) of clock CKc in clock cycle 1. In the case where m=2 holds, MR<2> is made high and the transfer gate TG2 is rendered conductive through the selector (AND2, NAND2, and NOR2). That is, when MR<2> is high, output Q2 of flip-flop FF2 is high and output Q3 of flip-flop FF3 is low, the output of NOR gate NOR2 goes high, the output of NAND gate NAND2 goes low, the output of AND gate AND2 goes high and both the PMOS transistor and NMOS transistor of transfer gate TG2 are turned on. Under these conditions, the second rising edge of clock CKc passes through transfer gate TG2 and the delay of 2·T1+tc is generated at node N0.

After the activate signal ACT is activated, output terminal Q2 of flip-flop FF2 is high and output Q3 of flip-flop FF3 goes high at the subsequent falling edge (the third falling edge) of clock CKc in clock cycle 2. Therefore, the output of NOR gate NOR2 goes low, the output of NAND gate NAND2 goes high, the output of AND gate AND2 goes low and both the PMOS transistor and NMOS transistor of transfer gate TG2 are turned off and rendered non-conductive.

In clock cycle 2, the pulse of clock CKc transmitted to node N0 is output as coarse timing signal CT via inverters INV2 and INV3. When clock CKc transmitted to node N0 transitions from high to low, the output of inverter INV2 goes high, pass transistor NM1 turns on, the charge at node N0 is discharged and node N0 falls to the low potential.

As a result, the coarse timing signal CT is capable of being generated as a one-shot pulse having the delay m·T1+tc decided by m (MR<0> to <7>) from the coarse delay register CDR. Here tc is an amount of delay that arises owing to passage of the clock pulse CKa through the interior of the coarse delay circuit CD. For example, tc corresponds to the sum of propagation delay times of AND gate AND8, a transfer gate and inverters INV2 and INV3.

The coarse delay circuit CD according to this example is capable of generating a delay exhibiting small fluctuation with respect to variations in temperature and process.

Further, the coarse delay circuit CD does not output the shift-register output per se as coarse timing and places the transfer gate through which the clock CKc passes in the conductive state (on state) beforehand at the falling edge of the clock CKc in the previous clock cycle. As a result, the path traversed by the clock is shortened and time difference between the output and the clock edge can be reduced. For example, when MR<2> is high in FIG. 3, output Q2 of flip-flop FF2 rises to the high level at the falling edge of clock CKc in clock cycle 1, the transfer gate TG2 is rendered conductive (turned on) in response, and the high-level pulse of clock CKc in clock cycle 2 is transmitted to node N0 via transfer gate TG2. The path traversed by clock CKc until it is output to node N0 is only the conductive transfer gate TG2 and the time difference between the output and the edge of clock CKc is reduced. Accordingly, the influence of fluctuations in delay time, which are ascribable to variations in process, voltage and temperature, on the coarse timing signal CT are suppressed.

Figure 4:
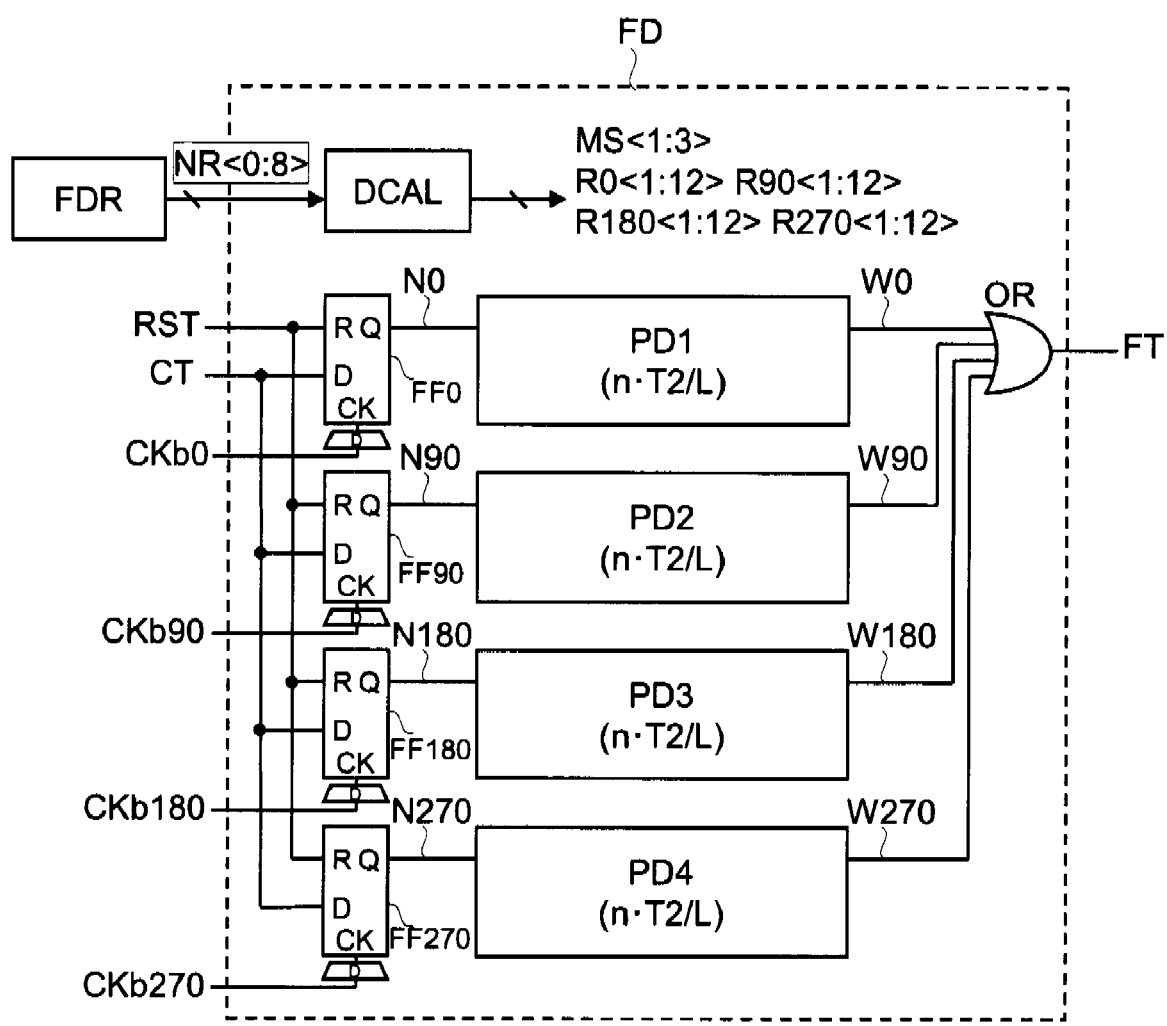
FIG. 4 is a diagram illustrating the configuration of a fine delay circuit (FD) in timing control circuit (TG) of FIG. 1A.

FIG. 4 is a diagram illustrating the configuration of the fine delay circuit FD of FIG. 1A. The fine delay circuit FD selects the phase of the clock input. As shown in FIG. 4, the fine delay circuit FD includes L (L=4 in FIG. 4) multiphase clock control delay circuits PD1, PD2, PD3 and PD4, a delay calculating circuit DCAL flip-flops FF0, FF90, FF180 and FF270, a 4-input OR gate OR and dummy selectors D.

The inputs of the multiphase clock control delay circuits PD1, PD2, PD3 and PD4 are connected to output terminals Q of the corresponding flip-flops FF0, FF90, FF180 and FF270, respectively.

The flip-flops FF0, FF90, FF180 and FF270 have data input terminals D to which the coarse timing signal CT is connected in common, and clock terminals CT to which the clocks B (CKb0, CKb90, CKb180 and CKb270), respectively, are connected via the dummy selectors D.

The dummy selectors D are the same as selectors (SEL1, SEL2 and SEL3 in FIG. 6) connected to clock input terminals of flip-flops in the multiphase clock control delay circuits PD1, PD2, PD3 and PD4, and they are inserted in order to achieve a match with the timing of the selectors.

In the multiphase clock control delay circuits PD1, PD2, PD3 and PD4, the coarse timing signal CT is transferred by driving multistage flip-flops by the clocks B of suitable phases in order that the coarse timing signal CT will be delayed by n times the phase difference (T2/L) between adjacent-phase clocks of the clocks B (CKb0, CKb90, CKb180 and CKb270).

Since the phase relationship between clock A (CKa) and coarse timing signal CT and the clocks B (CKb0, CKb90, CKb180 and CKb270) is not fixed, it is necessary to design the circuitry in such a manner that the circuitry can operate no matter what the phase relationship is between the clock A (CKa) and clocks B (CKb0, CKb90, CKb180 and CKb270).

Accordingly, in this exemplary embodiment, an arrangement is adopted in which the four juxtaposed multiphase clock control delay circuits PD1, PD2, PD3 and PD4 are started up and operated in parallel by respective ones of the different clocks B (CKb0, CKb90, CKb180 and CKb270), and the OR (logical sum) of the outputs of the multiphase clock control delay circuits PD1, PD2, PD3 and PD4 is taken to thereby generate the fine timing signal FT by utilizing whichever of the outputs of the multiphase clock control delay circuits PD1, PD2, PD3 and PD4 rises first.

The delay calculating circuit DCAL receives the value of n (where n is selected as NR<0:8>) from the fine delay register FDR and generates control signals (MS<1:3>, R0<1:12>, R(90)<1:12>, R(180)<1:12> and R270<1:12>) for producing a delay that is n times (T2/L). The details of the control signals (MS<1:3>, R0<1:12>, R(90)<1:12>, R(180)<1:12> and R270<1:12>) will be described later.

Figure 5:
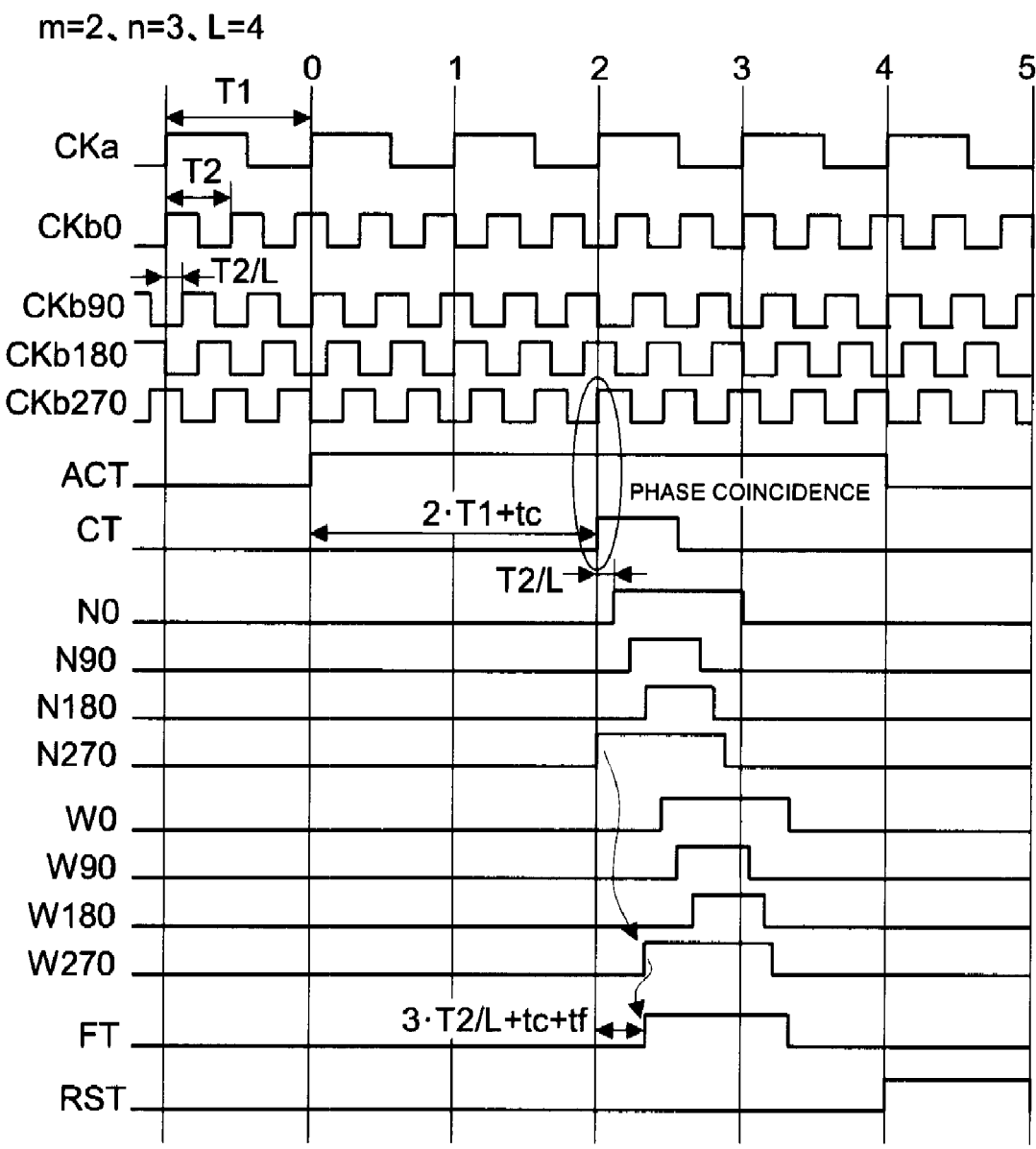
FIG. 5 is a diagram illustrating the operation waveforms of the fine delay circuit in FIG. 4.

FIG. 5 is a diagram illustrating the operation waveforms of the fine delay circuit FD in FIG. 4. In FIG. 5, N0, N90, N180 and N270 represent timing waveforms of output nodes N0, N90, N180 and N270, respectively, of the flip-flops FF0, FF90, FF180 and FF270, respectively, in FIG. 4. Further, W0, W90, W180 and W270 represent timing waveforms of output nodes W0, W90, W180 and W270, respectively, of the multiphase clock control delay circuits PD1, PD2, PD3 and PD4 in FIG. 4.

After the activate signal ACT is activated (i.e., after the activate signal ACT attains the high level in clock cycle 0), the coarse timing signal CT rises following two cycles of clock A (CKa).

The coarse timing signal CT is sampled by the flip-flops FF0, FF90, FF180 and FF270 in FIG. 4 in response to the clocks B (CKb0, CKb90, CKb180 and CKb270) and is output to the nodes N0, N90, N180 and N270, respectively.

In the example shown in FIG. 5, the rising edge of the coarse timing signal CT and the rising edge of the clock CKb270 coincide. In this case, the output node N270 of flip-flop FF270 in FIG. 4 rises first, then the respective output nodes N0, N90, N180 of flip-flops FF0, FF90, FF180 rise in succession after each is shifted by T2/L from its immediate predecessor. In the example shown in FIG. 5, CKb270 rises in the second cycle after the activate signal ACT goes high, N270, which is the output of flip-flop FF270 that samples the coarse timing signal CT at the rising edge of CKb270, goes high, and flip-flop FF270 samples the high coarse timing signal CT also at the next rising edge of the CKb270 within two cycles. Therefore, N270 remains high, flip-flop FF270 samples the coarse timing signal CT at the rising edge of CKb270 that immediately precedes the third cycle and N270 transitions to the low level. Further, after the activate signal ACT goes high, N90, which is the output of flip-flop FF90 that samples the coarse timing signal CT at the rising edge of CKb90 in the second cycle, goes high, flip-flop FF90 samples the high coarse timing signal CT at the rising edge of the next CKb90 within two cycles and N90 transitions to the low level. Thus, pulse width differs at the transition times of nodes N90 and N270 in conformity with the timing of the coarse timing signal CT and the timings of Ckb90 and CKb270. In the example shown in FIG. 5, the pulse widths of N90 and N180 are the same, and the pulse widths of N0 and N270 are the same.

The multiphase clock control delay circuits PD1, PD2, PD3 and PD4 each generate the delay n·(T2/L) (FIG. 5 illustrates a case where n=3 holds) with the clock signals of the respective flip-flops FF0, FF90, FF180 and FF270 on the input side serving as a reference.

More specifically, the multiphase clock control delay circuits PD1, PD2, PD3 and PD4 output the rising edges of the nodes N0, N90, N180 and N270 to W0, W90, W180 and W270, respectively, upon delaying them by 3·(T2/L).

In this case, W270, which is the output node of multiphase clock control delay circuit PD4, rises first.

The OR of W0, W90, W180 and W270 is taken and output as the fine timing signal FT. The rising edge of the fine timing signal FT is the result of delaying the rising edge of the coarse timing signal CT by 3·(T2/4)+tf (where tf is the delay of flip-flops and OR gate; it is a fixed value that is independent of T2). The falling edge of the fine timing signal FT corresponds to the falling edge of W0, which is the edge that falls last among W0, W90, WI80 and W270.

When the fine delay circuit FD of FIG. 4 is used, the timing of the rising edge of the fine timing signal FT is decided by period of clock A (CKa), the period of the clocks B (CKb0, CKb90, CKb180 and CKb270) and the phase difference between the clocks B (CKb0, CKb90, CKb180 and CKb270). This means that the influence of the process, supply voltage and temperature can be diminished.

Figure 6A:
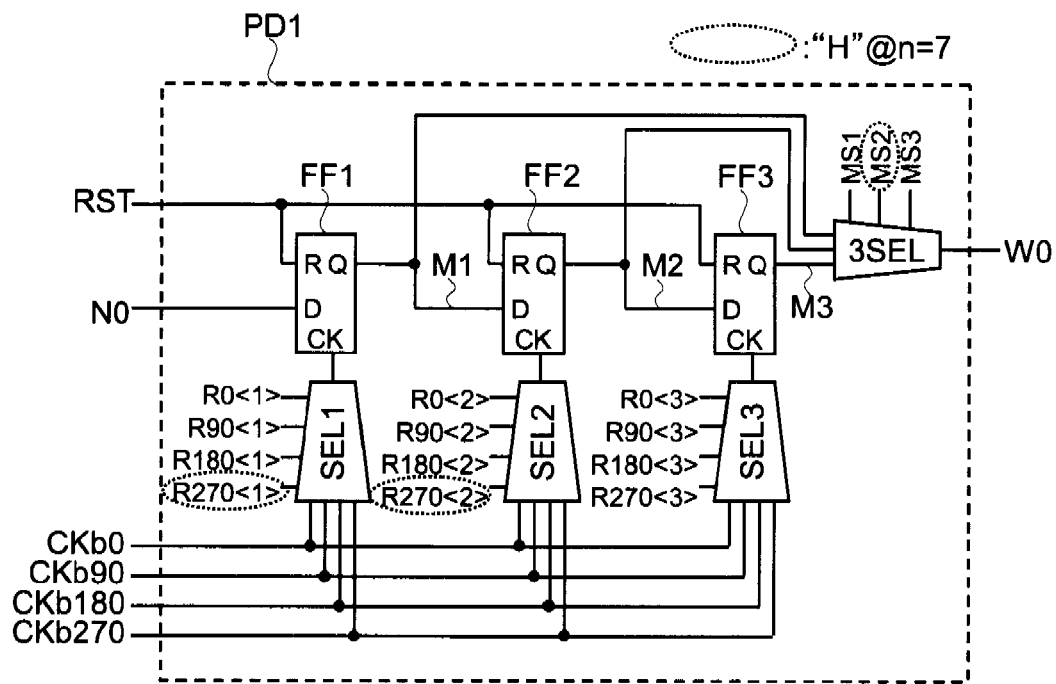
FIG. 6A is a diagram illustrating the circuit configuration of a multiphase clock control delay circuit (PD1)

FIG. 6A is a diagram illustrating the circuit configuration of the multiphase clock control delay circuit PD1 in FIG. 4. The multiphase clock control delay circuits PD1, PD2, PD3 and PD4 of FIG. 5 are identical in terms of internal structure. As shown in FIG. 6A, the multiphase clock control delay circuit PD1 includes flip-flops FF1, FF2, FF3 of three stages each having its output Q connected to the data input terminal D of the next stage (with the exception of flip-flop FF3); 4-input selectors SELi (i=1, 2, 3) for receiving the clocks B (CKb0, CKb90, CKb180 and CKb270) as inputs, selecting and outputting one of these based upon the clock input phase selection signals R0<i>, R90<i>, R180<i>, R270<i>, and inputting the selected clocks to clock terminals CK of the flip-flops FFi (i=1, 2, 3); and a 3-input selector 3SEL for receiving the outputs of the flip-flops FF1, FF2, FF3 as inputs, selecting one of these based upon node selection signals MS1, MS2, MS3 and outputting the selected signal to W0.

Figure 6B:
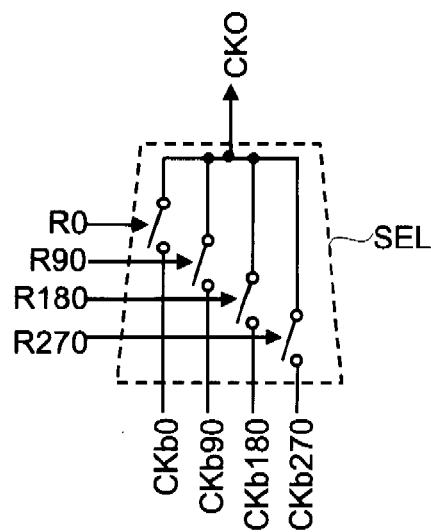
FIG. 6B is a diagram illustrating the configuration of a 4-input selector in FIG. 4A.

FIG. 6B is a diagram illustrating the circuit configuration of the 4-input selectors SEL1, SEL2, SEL3. The 4-input selectors SEL1, SEL2, SEL3 are identical in terms of internal structure. As shown in FIG. 6B, the 4-input selector SEL uses the clock input phase selection signals R0, R90, R180, R270 to select and output one of the clocks B (CKb0, CKb90, CKb180 and CKb270).

The 3-input selector 3SEL of FIG. 6A selects one of the output nodes M1, M2, M3 of flip-flop FF1, FF2, FF3 by the node selection signals MS1, MS2, MS3 and outputs the selected node as W0.

Node N0 (output node N0 of flip-flop FF0 in FIG. 4) is connected to the data input of flip-flop FF1 and the rising edge of the coarse timing signal CT sampled by flip-flop FF0 (see FIG. 4) at CKb0 is supplied to the data input.

This signal is loaded by flip-flop FF1 in the multiphase clock control delay circuit PD1 of FIG. 6A and a delay is produced when it is sent to the next flip-flop FF2. Here a case where a delay of n=7 is produced will be described as one example.

In FIG. 6A, it is assumed that a delay of 3·(T2/L) (L=4) is produced by flip-flop FF1. Since the rising edge of node N0 (the output node of flip-flop FF0 in FIG. 4) is in phase with the rising edge of CKb0, the clock input phase selection signal R270<1> of the 4-input selector SEL1 is placed at the high level, R0<1>, R90<1>, R180<1> are placed at the low level, CKb270 is selected by the 4-input selector SEL1 and CKb270 is supplied to the clock terminal CK of flip-flop FF1. When this occurs, the high signal at node N0 is output to M1 upon being delayed by 3·(T2/L) from the rising edge of CKb0 by CKb270.

Next, in order to delay the signal at M1 by 4·(T2/L) using flip-flop FF2, the clock input phase selection signal R270<2> of the 4-input selector SEL2 is placed at the high level, R0<2>, R90<2>, R180<2> are placed at the low level, CKb270 is selected by the 4-input selector SEL2 and CKb270 is supplied to the clock terminal CK of flip-flop FF2. When this occurs, the high signal at M1 is output to M2 upon being delayed by 4·(T2/L) by CKb270. That is, flip-flop FF2 loads the high signal, which the flip-flop FF1 of the preceding stage output to the output node M1 in synch with CKb270, at a timing delayed by 360° (T2) from the rising edge of CKb270 of flip-flop FF1. As a result, the signal at M1 is delayed by 4·(T2/4) by flip-flop FF2.

In order to output the signal at M2 as W0, the node selection signal MS2 of the 3-input selector 3SEL is made high and the 3-input selector 3SEL selects M2.

If such an arrangement is adopted, the delay of n=7 can be split into 3 and 4 and a delay of 4·(T2/4) can be generated. In this case, the clock input phase selection signals R0<3>, R90<3>, R180<3>, R270<3> of the 4-input selector SEL3 are "Don't care" (because the output node M3 of the flip-flop FF3 is not selected by the 3-input selector SEL), and it may be so arranged that all of these are made low so that a clock is not supplied to the clock terminal CK of flip-flop FF3, or it may be so arranged that any one of R0<3>, R90<3>, R180<3>, R270<3> is made high to thereby select a certain clock.

Figures 7A, 7B:
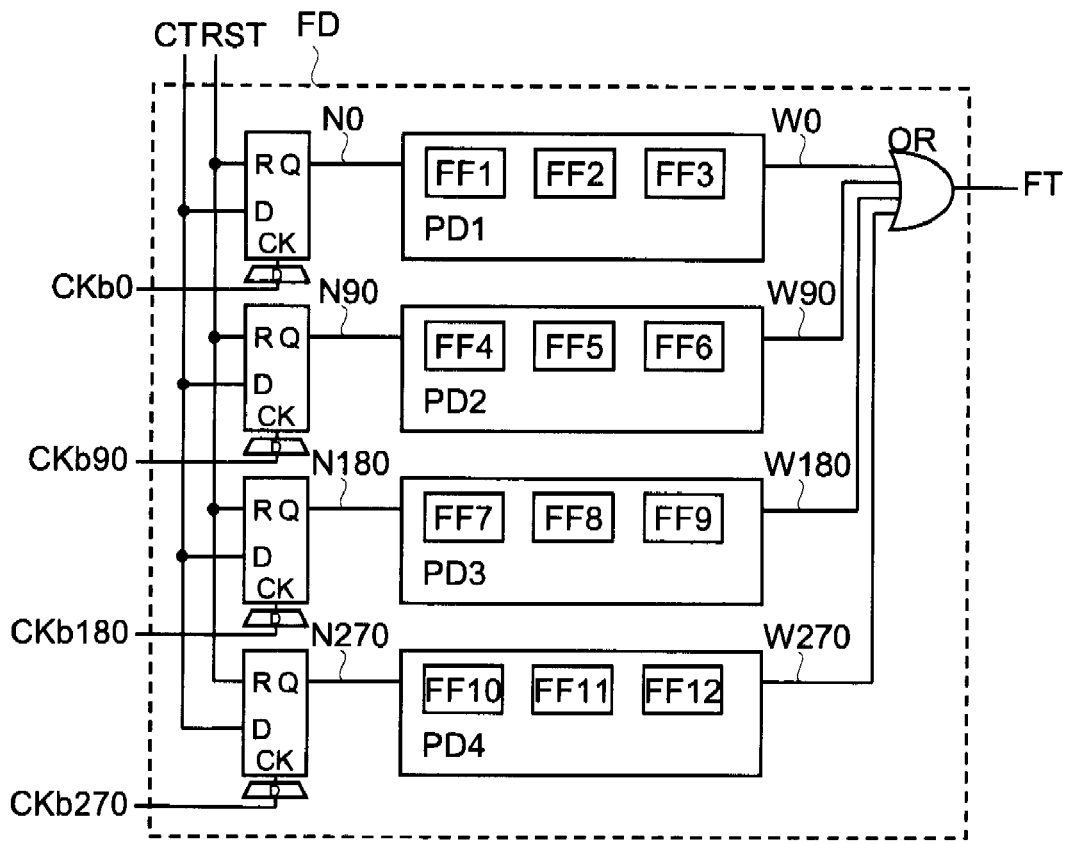
FIG. 7A is a diagram illustrating numbers assigned to flip-flops in the fine delay circuit of FIG. 4.
FIG. 7B is a diagram illustrating clock input phase selection signals that rise to the high level in the flip-flops with respect to set values of delay n.

FIG. 7A illustrates the three flip-flops, which have been described with reference to FIG. 6A, as (FF1, FF2, FF3), (FF4, FF5, FF6), (FF7, FF8, FF9) and (FF10, FF11, FF12), in respective ones of the multiphase clock control delay circuits PD1, PD2, PD3 and PD4 of the fine delay circuit FD shown in FIG. 4.

FIG. 7B illustrates, in chart form, those of the clock input phase selection signals R0, R90, R180, R270 corresponding to the flip-flops FF1 to FF12 of the multiphase clock control delay circuits PD1, PD2, PD3 and PD4 shown in FIG. 7A that attain the high level when the value of n has been decided. In FIG. 7B, the symbol "-" represents "don't care". Further, node selection signals MS1, MS2, MS3 that are to made high also are indicated in correspondence with n.

By way of example, in the case where n=7 holds, R270<1>, R270<2> at flip-flops FF1, FF2 of the multiphase clock control delay circuit PD1 are high, and a signal delayed by 7·(T2/L) from the rising edge of N0 is output to W0. Further, R0<1>, R0<2> at flip-flops FF4, FF5 of the multiphase clock control delay circuit PD2 are high, and a signal delayed by 7·(T2/L) from the rising edge of N90 is output to W90. The delay between the rising edge of N90 (the rising edge of CKb90) and the rising edge of the output of flip-flop FF4 driven by CKb0 is 3·(T2/L), and the delay between the rising edge of the output of flip-flop FF4 and the rising edge of the output of flip-flop FF5 that loads the high potential at the next rising edge of CKb0 is 4·(T2/L). Further, R90<1>, R90<2> at flip-flops FF7, FF8 of the multiphase clock control delay circuit PD3 are high, and a signal delayed by 7·(T2/L) from the rising edge of N180 is output to W180. The delay between the rising edge of N180 (the rising edge of CKb180) and the rising edge of the output of flip-flop FF7 driven by CKb90 is 3·(T2/L), and the delay between the rising edge of the output of flip-flop FF7 and the rising edge of the output of flip-flop FF8 that loads the high potential at the next rising edge of CKb90 is 4·(T2/L). R270<1>, R270<2> at flip-flops FF1, FF2 of the multiphase clock control delay circuit PD1 are high, and a signal delayed by 7·(T2/L) from the rising edge of N0 is output to W0. Similarly, R180<1>, R180<2> at flip-flops FF0, FF11 of the multiphase clock control delay circuit PD4 are high, and a signal delayed by 7·(T2/L) from the rising edge of N270 is output to W270.

With the fine delay circuit FD of FIG. 7A, a delay having a resolution of T2/L can be obtained using the clocks of period T2 of clocks B. Accordingly, since it is unnecessary to use a high-speed clock, power consumption can be reduced. An additional advantage is that operation is possible even if the operating speeds of circuits from flip-flops on down are slow.

Figure 8A:
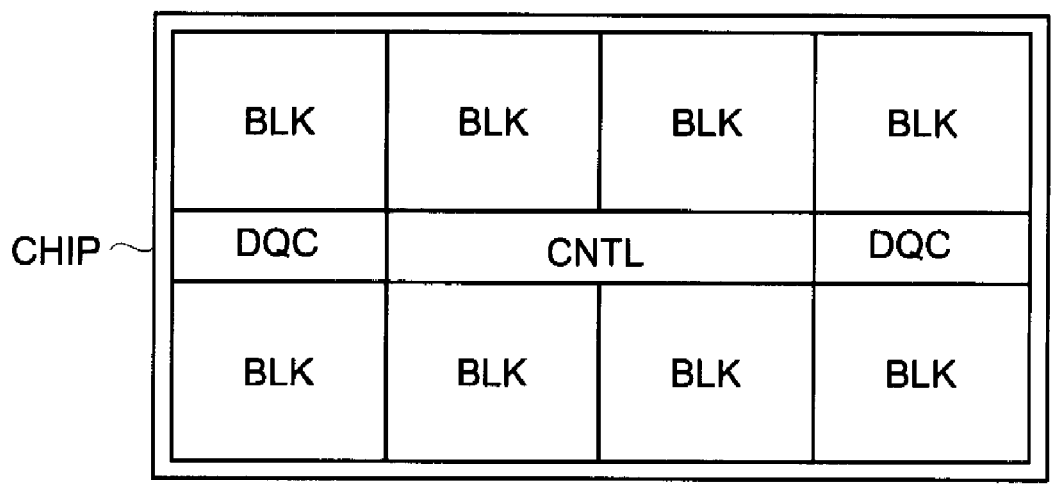
FIGS. 8A and 8B are diagrams illustrating an example of the overall configuration of a DRAM chip, which is equipped with the timing control circuit TG according to the exemplary embodiment of the present invention, and an example of the configuration of a memory bank, respectively.
Figure 8B:
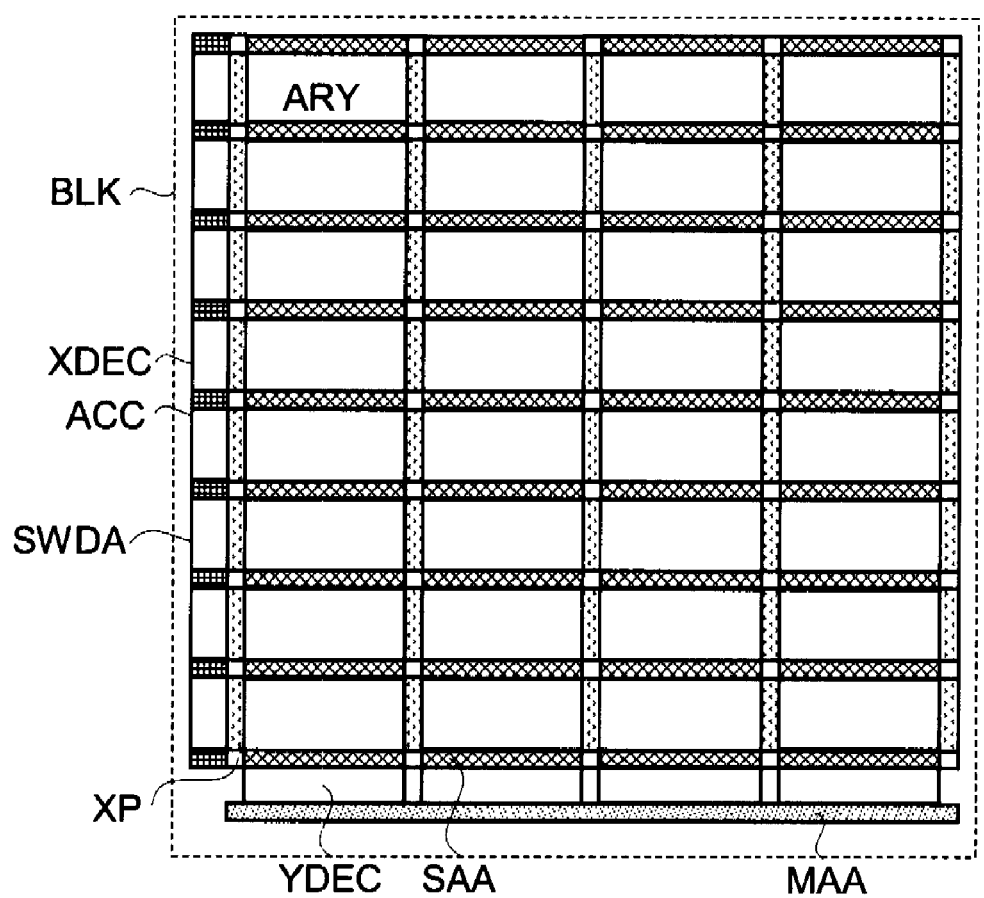

FIGS. 8A and 8B are plan views schematically illustrating an example of chip configuration in a semiconductor storage device according to an exemplary embodiment of the present invention, in which FIG. 8A is an example of the configuration of the overall chip and FIG. 8B an example of the configuration of a memory bank in FIG. 8A.

The semiconductor storage device illustrated in FIG. 8A is a DRAM. The configuration of the overall memory chip (CHIP) is broadly divided into a control circuit CNTL, input/output circuits DQC and memory blocks BLK, as illustrated in FIG. 8A.

A clock, address and control signal are supplied to the control circuit CNTL from outside the memory chip (CHIP), the operating mode of the memory chip is decided and pre-decoding of the address is carried out.

Input/output circuit DQC has an input/output buffer, etc., inputs write data from outside the memory chip and outputs read data to the exterior of the memory chip.

As shown for example in FIG. 8B, a plurality of memory arrays (ARY) in array form are disposed in the memory block, and a sense amplifier row SAA, subword driver row SWDA and cross area XP are disposed surrounding the array.

Further, a column decoder YDEC and a main amplifier row MAA are disposed in parallel with the sense amplifier row SAA at the outer periphery of the memory block BLK, and a row decoder XDEC and array control circuit ACC are disposed in parallel with the subword driver row SWDA at the outer periphery of the memory bank.

Figure 9:
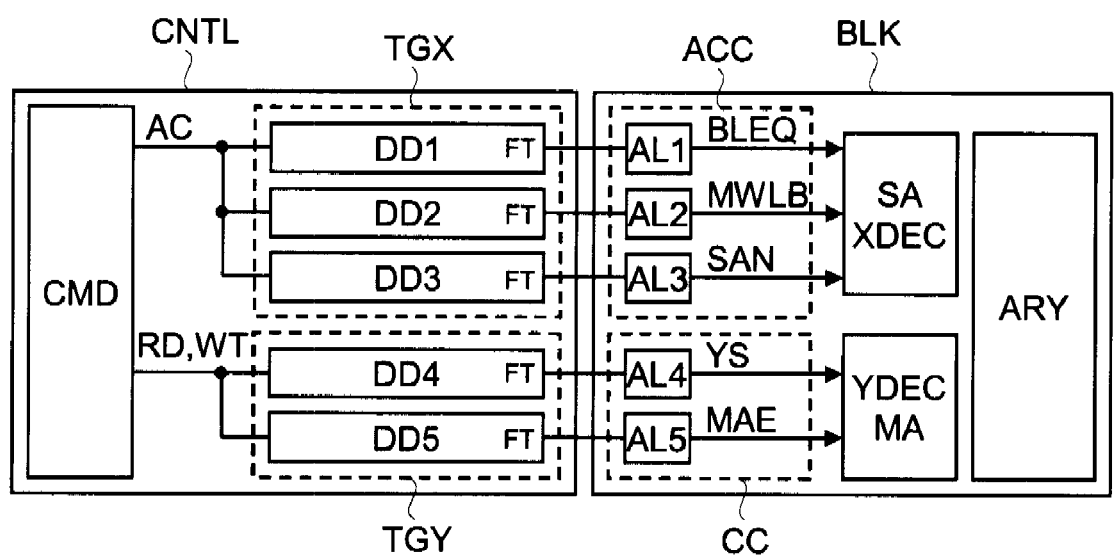
FIG. 9 is a diagram illustrating the configurations of a control circuit and memory block of the DRAM chip in FIG. 8.

FIG. 9 is a diagram illustrating an example of the configurations of the control circuit CNTL and memory block BLK. An activate command AC issued by a command decoder CMD is supplied to a timing control circuit TGX having the construction according to the example described above. Using digital delay elements DD1 to DD3, the timing control circuit TGX generates the fine timing signals FT.

The fine timing signals FT are supplied to the memory block BLK and, after passing through logic AL within the array control circuit ACC, are used to generate the timings of a bit-line equalization signal BLEQ, main word line MWLB and sense-amplifier signal SAN used in the sense amplifier SA and row decoder XDEC.

Further, a read command RD and a write command WT issued by the command decoder CMD are supplied to a timing control circuit TGY having the construction according to the example described above. Using digital delay elements DD4 to DD5, the timing control circuit TGY generates the fine timing signals FT. The fine timing signals FT are supplied to the memory block BLK and, after passing through logic AL within a column control circuit CC, are used to generate the timings of a column select signal YS and main-amplifier activate signal MAE used in the column decoder YDEC and main amplifier MA.

By using the timing control circuits TGX, TGY described in the example set forth above, it is possible to reduce amount of fluctuation in these timings ascribable to variations in process, supply voltage and temperature, and access time can be shortened.

Figure 10:
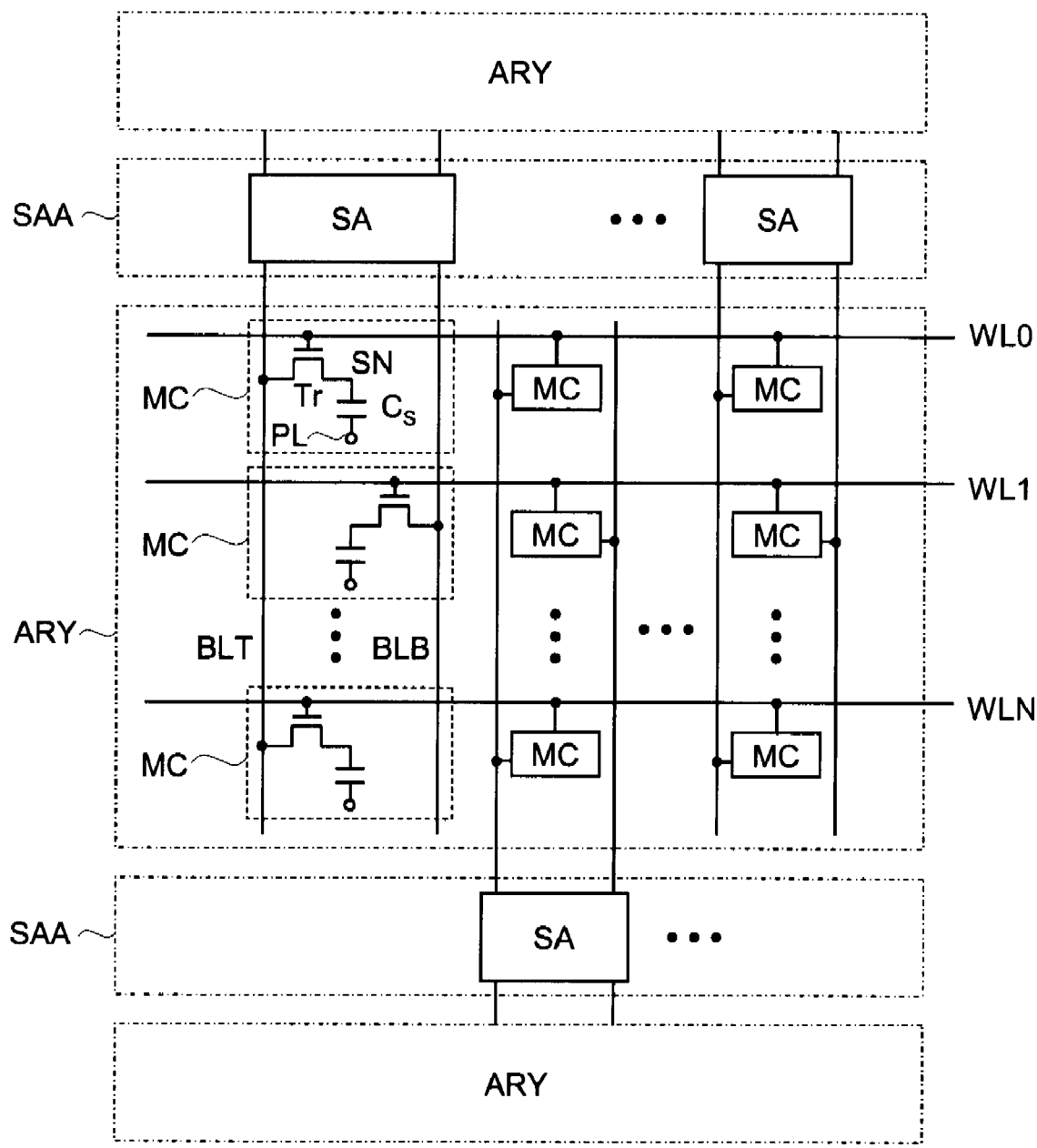
FIG. 10 is a diagram illustrating the circuit configuration of one example (folded bit line) of a memory array used by the DRAM chip of FIG. 8.
Figure 11:
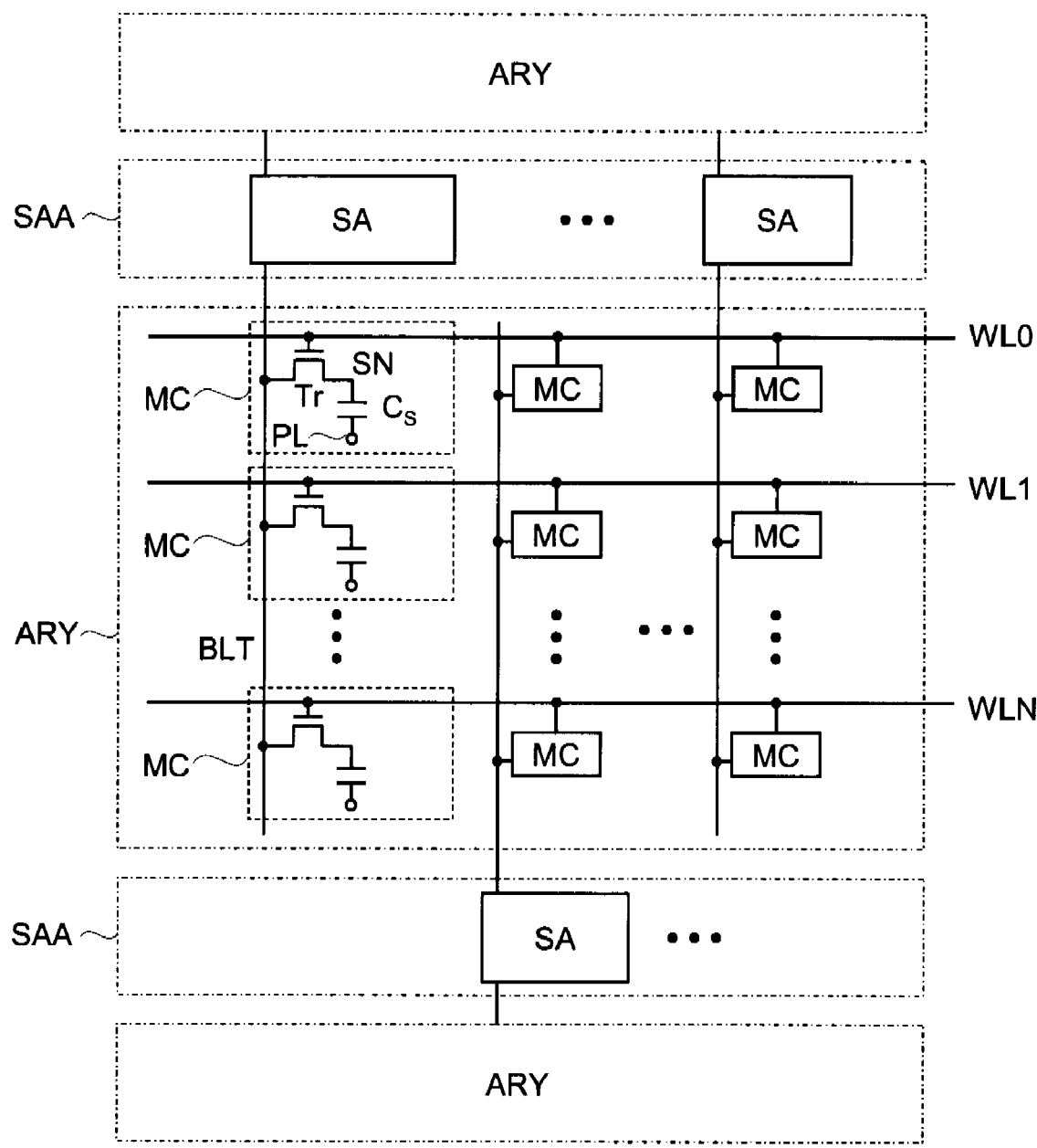
FIG. 11 is a diagram illustrating the circuit configuration of another example (open bit line) of a memory array used by the DRAM chip of FIG. 8.

FIGS. 10 and 11 are diagrams illustrating examples of memory-array configurations in the semiconductor storage device of FIGS. 8A, 8B. As illustrated in FIGS. 10 and 11, memory arrays ARY are composed of a plurality of memory cells MC. Each memory MC is a DRAM memory cell and is constituted by a single MOS transistor Tr and a single capacitor Cs. Either the source or drain of the memory cell transistor Tr is connected to a bit line (BLT or BLB), and the other of the source and drain is connected to a storage node SN. The gate is connected to a word line WL.

One end of the capacitor Cs is connected to the storage node SN, and the other end is connected to a common plate PL. It should be noted that the bit line BLT and bit line BLB function as a bit-line pair (complementary bit lines) and are connected to the same sense amplifier SA.

Sense amplifier rows SAA are placed above and below the memory array ARY and alternate with it, are connected in common with the bit-line pairs (BLT/BLB) within the memory arrays ARY above and below, and are shared by the two. Further, within each sense amplifier row SAA, adjacent sense amplifiers are placed astride a space equivalent to one bit-line pair. By adopting this arrangement, the pitch of the sense amplifiers SA is reduced, layout of the sense amplifiers SA is facilitated and microfabrication is possible.

The configuration shown in FIG. 10 uses a folded bit line array, in which memory cells are placed at half of the intersections of word and bit lines. This array is advantageous in that noise at the time of operation is small and in that the operating margin is large.

The configuration shown in FIG. 11 uses an open bit line array, in which memory cells are placed at all of the intersections of word and bit lines. This is advantageous in that the size of memory cells can be reduced.

Figure 12:
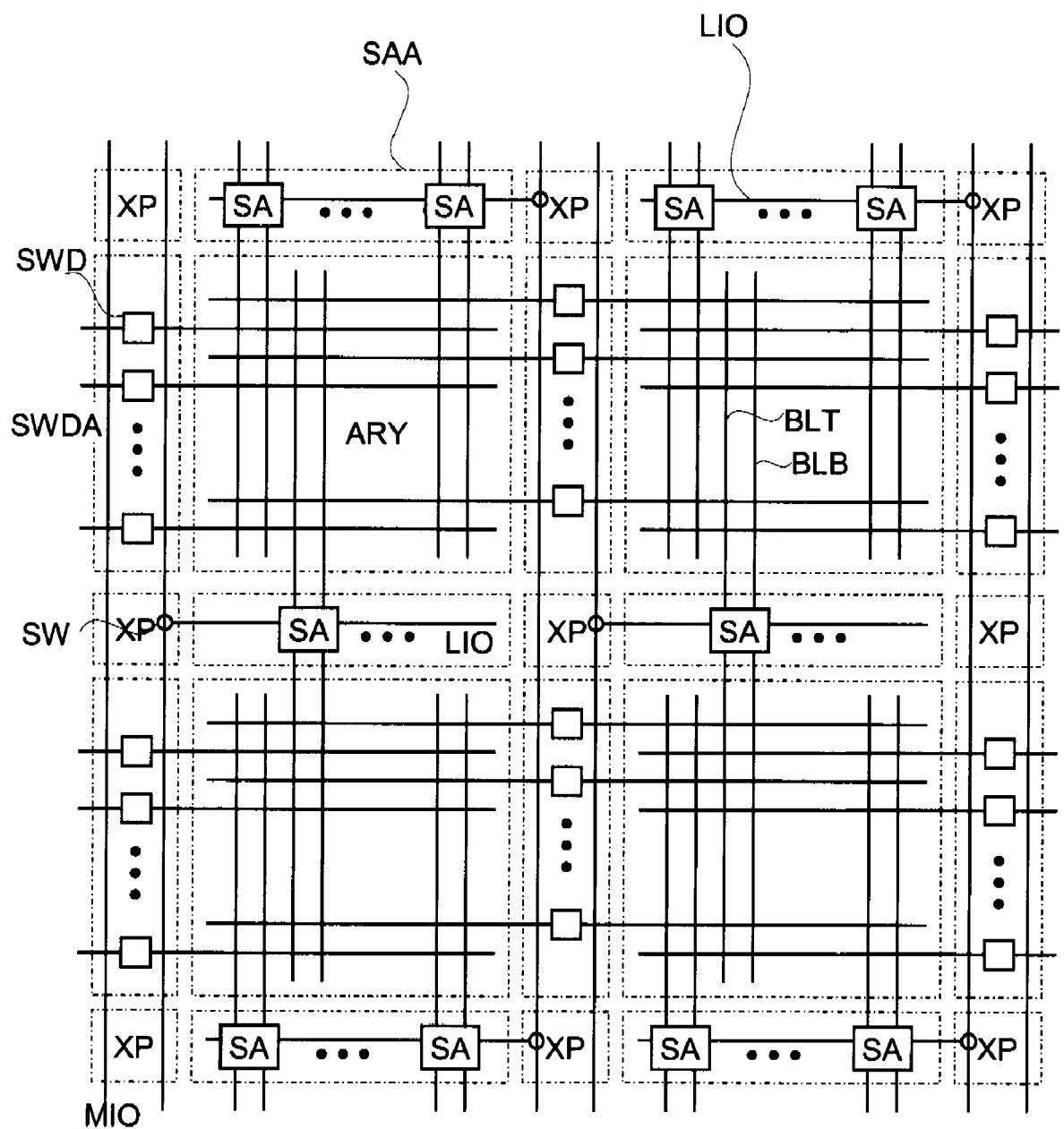
FIG. 12 is a diagram illustrating a circuit configuration indicating connections among memory arrays, subword driver rows and sense amplifier rows used in the DRAM chip of FIG. 8A.

FIG. 12 is a plan view illustrating an example of the details of the placement arrangement of sense amplifier rows and subword driver rows in the semiconductor storage device of FIGS. 8A, 8B. As shown in FIG. 12, sense amplifiers SA in sense amplifier rows SAA are placed above and below memory arrays ARY, alternate with them and are connected in common with bit-line pairs BLT/BLB within the memory arrays ARY above and below.

Similarly, subword drivers SWD in subword driver rows SWDA are placed at the right and left of the memory arrays ARY, alternate with them and are connected in common with word lines WL within the memory arrays ARY to the right and left. By adopting such an arrangement, the pitch of the subword drivers SWD in the subword driver row SWDA can be widened to twice the pitch of the word lines WL in the memory array ARY.

Further, a local I/O line LIO is disposed in the sense amplifier row SAA, and the I/O line is connected to a main I/O line MIO via a switch SW in a cross area XP.

At the time of a read operation, the data in the sense amplifier SA is read out to the exterior of the chip via the local I/O line LIO and main I/O line MIO. At the time of a write operation, data is written to the sense amplifier SA from outside the chip via the main I/O line MIO and local I/O line LIO.

Figure 13:
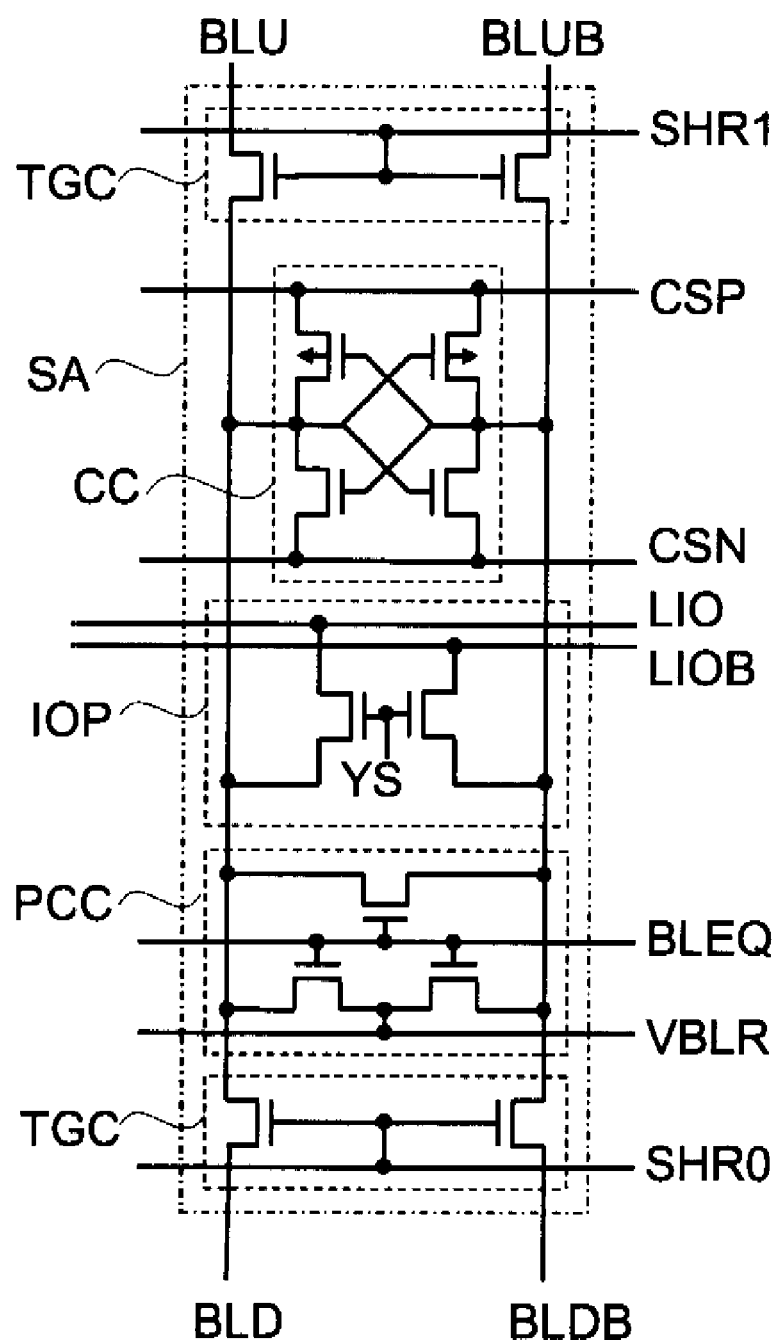
FIG. 13 is a diagram illustrating the circuit configuration of a sense amplifier used by the DRAM chip of FIG. 8A.

FIG. 13 is a diagram illustrating an example of the configuration of a sense amplifier. Included within each sense amplifier SA are a transfer gate TGC, a precharging circuit PCC, a cross-coupled amplifier CC and a read/write port IOP.

The transfer gate TGC is a circuit that connects bit lines BLD, BLDB of the sense amplifier SA and bit lines BLU, BLUB of the memory array ARY when a sense-amplifier isolation signal (SHR signal) is activated.

The precharging circuit PCC equalizes the bit-line pair (BLT, BLB) and precharges the pair to a bit-line precharge level VBLR when the bit-line equalization signal BLEQ is activated. The bit-line precharge level VBLR usually is set to VDL/2, which is the midpoint of a voltage VDL of the bit-line amplitude (a level the same as or stepped down from that of supply voltage VCC provided from outside the chip).

The cross-coupled amplifier CC is a circuit which, after a very small readout signal from the memory cell MC has been generated on the bit-line pair, drives a common-source line CSP on the side of a PMOS transistor to voltage VDL, drives a common-source line CSN on the side of an NMOS transistor to ground voltage VSS, amplifies whichever of the bit lines BLD, BLDB has the higher voltage to VDL, amplifies whichever of the bit lines BLD, BLDB has the lower voltage to VSS and latches the amplified voltages.

The read/write port IOP is a circuit for connecting local I/O line (LIO line) LIOT/LIOB to bit-line pair BLD/BLDB when column select line YS is activated. It should be noted that LIO line LIOT/LIOB is held at the precharge level at the time of standby in order to prevent current consumption in a non-selected sense amplifier row SAA.

Figure 14:
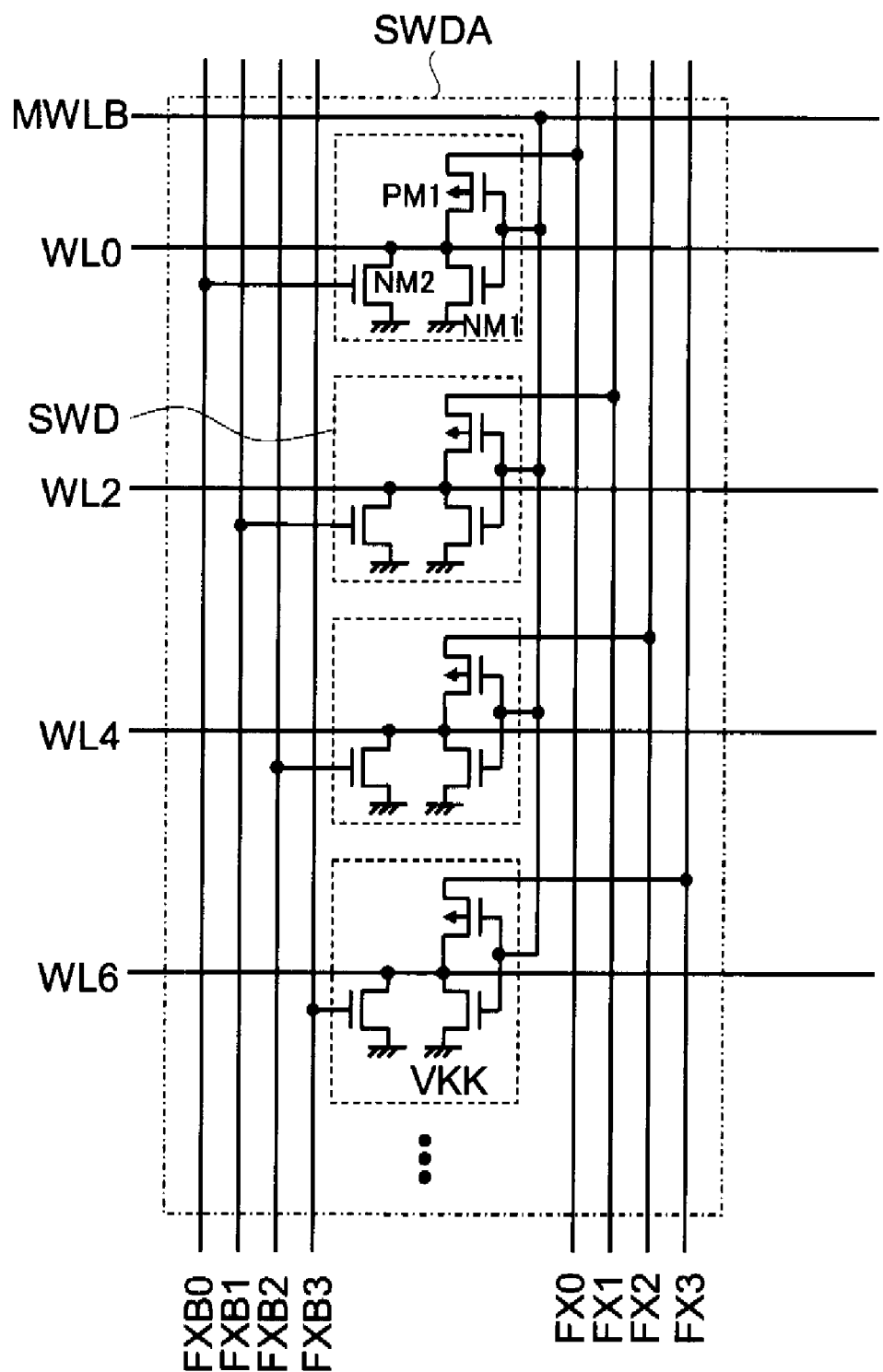
FIG. 14 is a diagram illustrating the circuit configuration of a subword driver used by the DRAM chip of FIG. 8A.

FIG. 14 is a diagram illustrating an example of the configuration of the subword driver row in the semiconductor storage device of FIG. 8. The subword driver row SWDA is composed of a plurality of subword drivers SWD. The subword driver row SWDA is disposed at the periphery of the memory array ARY, as illustrated in FIG. 8B, etc.

The subword driver SWD drives word lines WL in memory arrays ARY disposed on both sides. As described with reference to FIG. 12, the subword driver rows SWDA are disposed alternatingly with the memory arrays ARY, and therefore the word lines WL (subword lines) in the memory arrays ARY are connected to the left and right subword drivers SWD every other line.

The subword driver SWD is composed of two N-channel MOS transistors NM1, NM2 and a P-channel MOS transistor PM1. One N-channel MOS transistor NM1 has a gate to which the main word line MWLB is connected, a drain to which a word line WL is connected and a source to which voltage VKK is connected. The other N-channel MOS transistor NM2 has a gate to which a complementary word driver select line FXBi (i=1, 2, 3) is connected, a drain to which a word line WL is connected and a source to which voltage VKK is connected. The voltage VKK is a voltage lower than VSS generated by a negative-voltage generating circuit.

The P-channel MOS transistor PM1 has a gate to which main word line MWLB is connected, a drain to which word line WL is connected and a source to which a subword driver select line FXi (i=1, 2, 3) is connected.

Four subword driver select lines FX0 to FX3 are wired on one subword driver row SWDA, and any one among four subword drivers SWD selected by one main word line MWLB is selected and one word line WL is activated.

Figure 15:
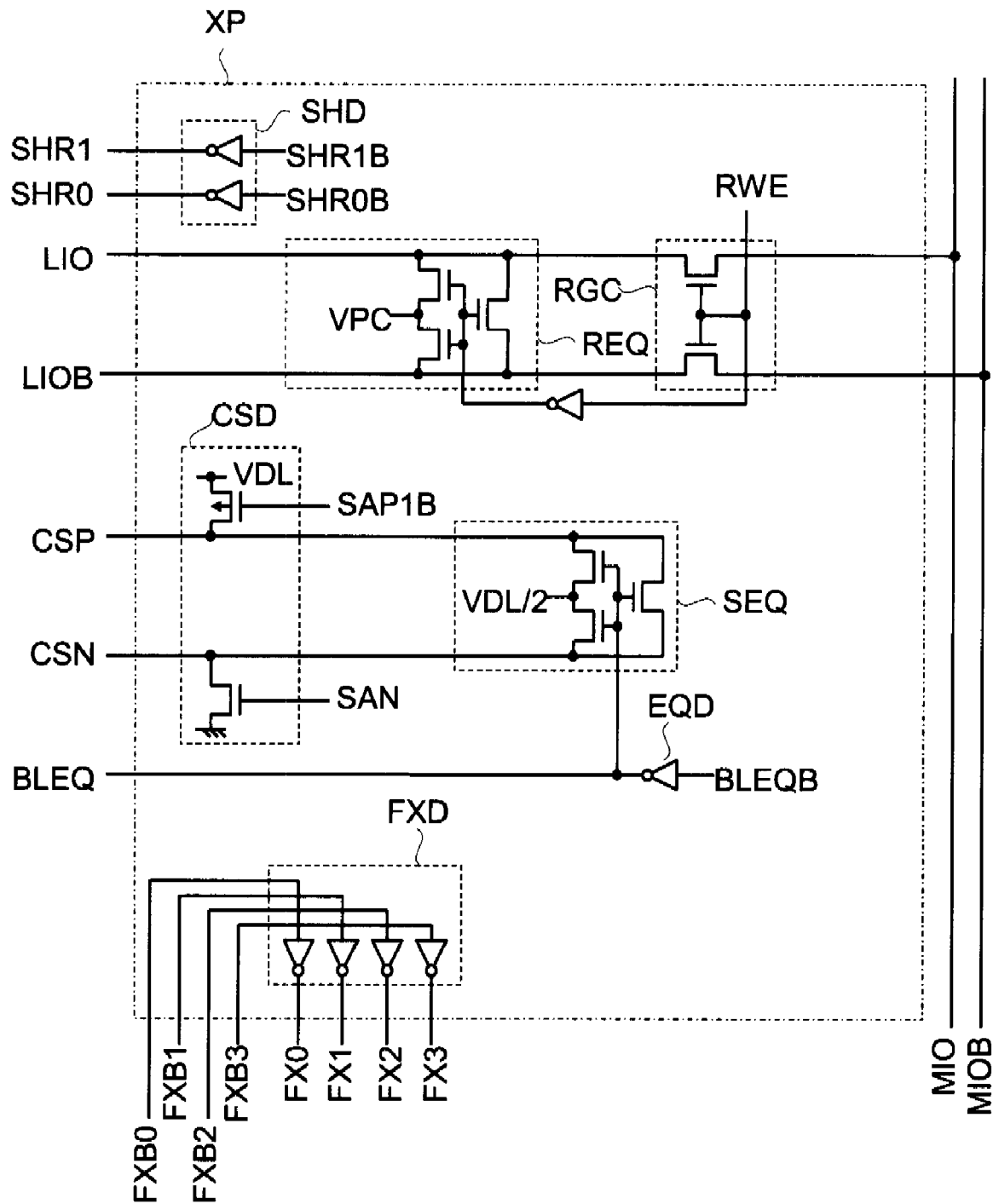
FIG. 15 is a diagram illustrating the circuit configuration of a cross area used by the DRAM chip of FIG. 8A.
Figure 16A:
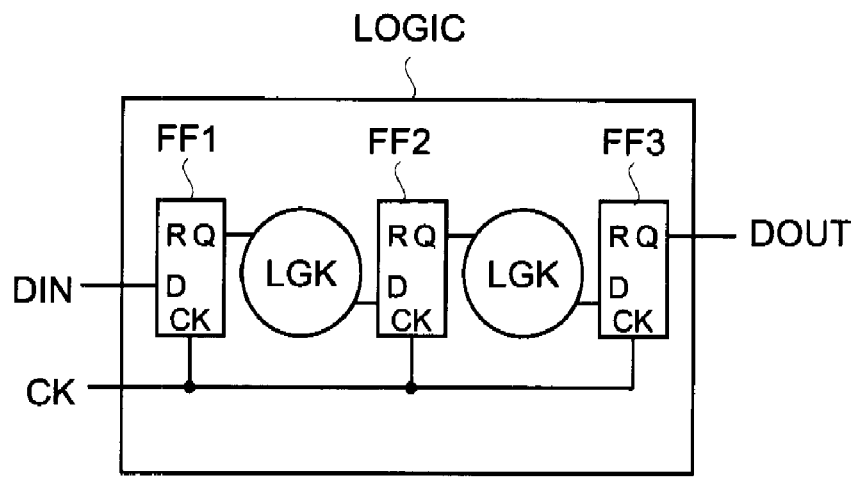
FIGS. 16A and 16B are diagrams illustrating timing control schemes in a logic LSI chip and synchronous DRAM, respectively.
Figure 16B:
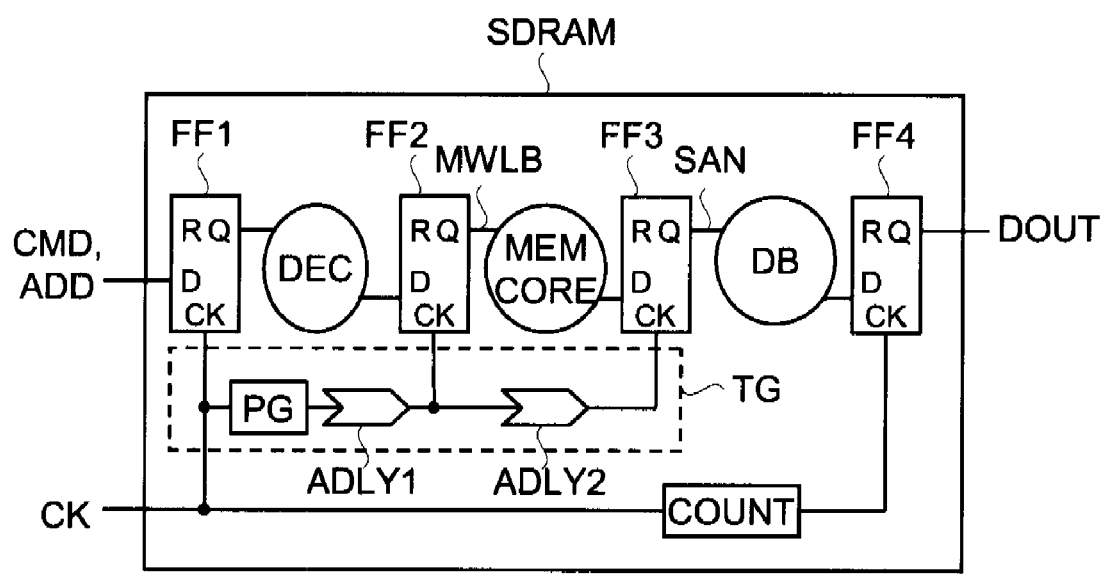
Figure 17A:
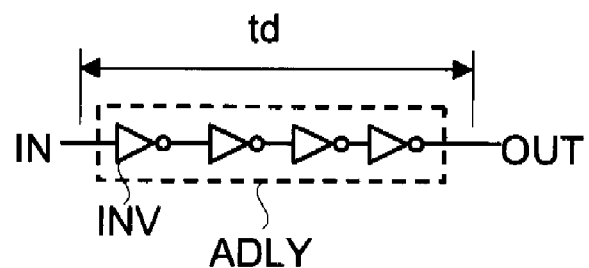
FIGS. 17A and 17B are diagrams illustrating the circuit configuration and delay characteristic, respectively, of an analog delay used in a conventional timing control scheme in a synchronous DRAM.
Figure 17B:
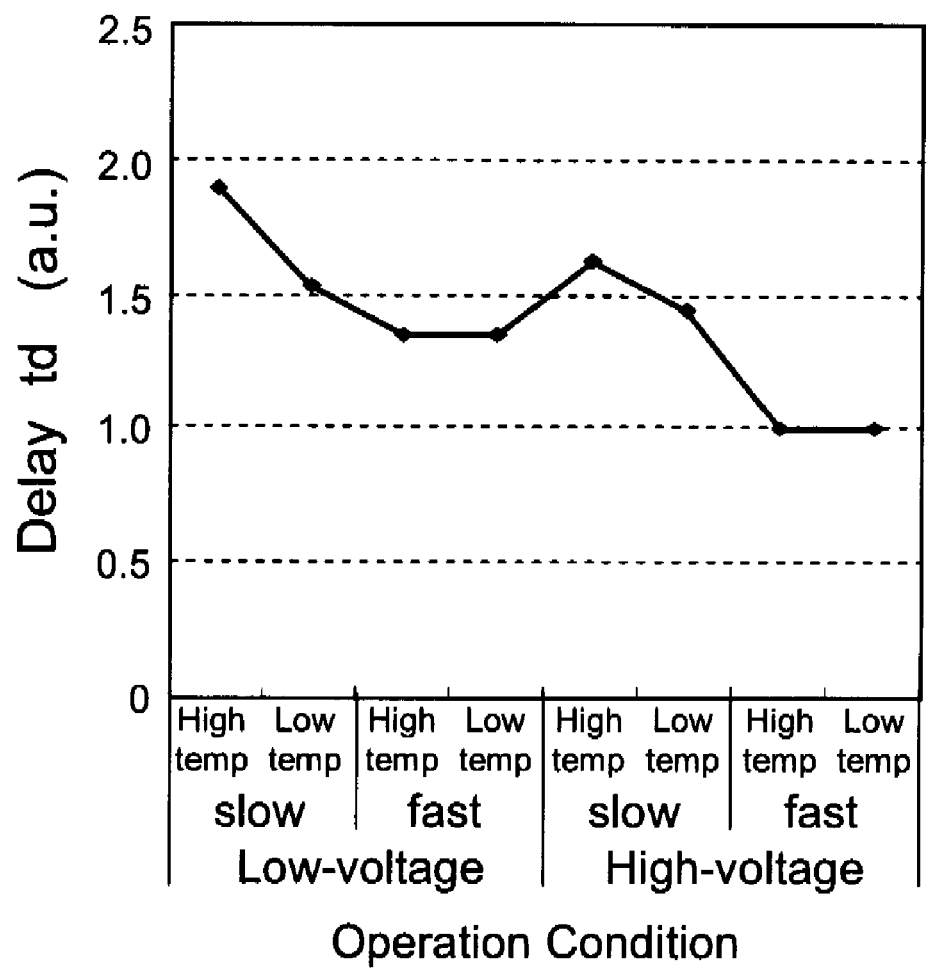
Figure 18A:
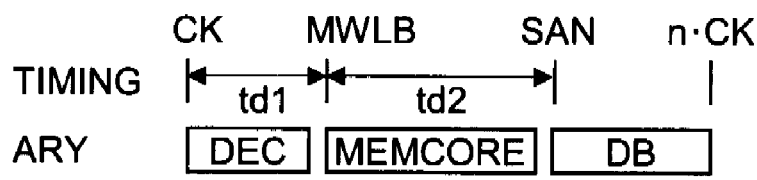
FIGS. 18A and 18B are diagrams illustrating operation timings of circuit blocks within a chip in a case where the conventional timing control scheme is used in a synchronous DRAM.
Figure 18B:
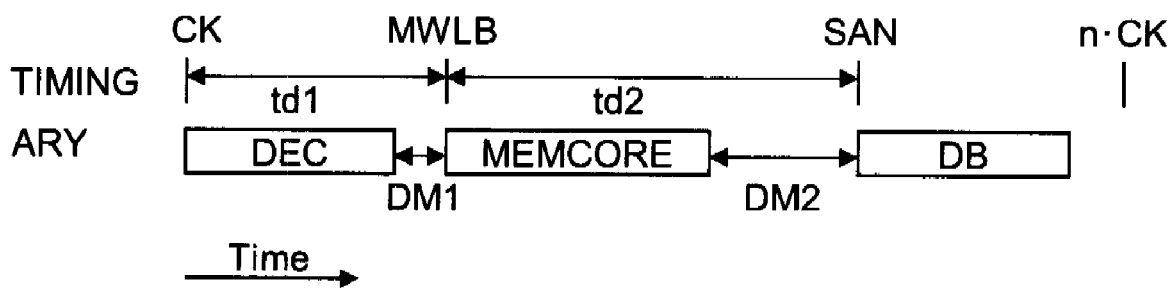

FIG. 15 is a diagram illustrating an example of the configuration of the cross area XP in the semiconductor storage device of FIG. 8. As shown in FIG. 15, the cross area XP includes an SHR signal driver SHD, an LIO line precharging circuit REQ, a read/write gate RGC, a CS line driver CSD, a CS line precharging circuit SEQ, a BLEQ signal driver EQD, and an FX line driver FXD.

The SHR signal driver SHD receives a complementary signal SHRB of the SHR signal as an input and outputs a signal that is the inverse of this signal. The LIO line precharging circuit REQ precharges the LIO line LIOT/B to voltage VPC when a read/write-enable signal RWE is at the VSS level, which is the deactivated state.

The read/write gate RGC connects the LIO line LIOT/B and the main IO line MIOT/B when the read/write-enable signal RWE is at the activated-state voltage VCL (a level the same as or stepped down from the external VCC level and used as supply voltage for peripheral circuits).

The CS line driver CSD drives the NMOS-side common-source line CSN (see FIG. 13) of the sense amplifier to the ground voltage VSS when the NMOS-side sense-amplifier enable signal SANS is in the activated state, and drives the PMOS-side common-source line CSN (see FIG. 13) of the sense amplifier to the voltage VDL (the high level of the bit line) when the PMOS-side sense-amplifier enable signal SAP1B is in the activated state (VSS level).

The CS line precharging circuit SEQ precharges the PMOS-side and NMOS-side common-source lines CSP, CSN (see FIG. 13) to VDL/2 when the BLEQ signal has been activated.

The BLEQ signal driver EQD receives a complementary signal BLEQB of the precharging signal BLEQ as an input and outputs a signal that is the inverse of this signal.

The FX line driver FXD receives signal FXB as an input and outputs the complementary signal to subword line driver select line FX (FX line).

The timing control signal of the present invention represents a technology particularly useful in application to DRAM products, etc. However, the signal is not limited to such application and is also applicable to on-chip memories and the like incorporated within a logic chip of a microprocessor or DSP (Digital Signal Processor), etc. Furthermore, according to the present invention, since time for locking as in a DLL having a feedback loop is not required, the invention is applicable to any timing generator and system.

Though the present invention has been described in accordance with the foregoing examples, the invention is not limited to these examples and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A timing control circuit comprising:
a digital delay circuit that receives a first clock signal having a first period, a group of second clocks having a second period with phases spaced apart from each other at prescribed intervals, an activate signal, and a selection signal for setting a delay amount, the digital delay circuit generating a signal delayed by a prescribed multiple of the first period based upon the selection signal, with an effective edge of the first clock signal at the time when the activate signal is activated serving as a reference, sampling the signal delayed by the prescribed multiple of the first period in response to respective ones of the group of second clocks to produce a plurality of signals, adding a delay to the plurality of signals, based upon the selection signal, the delay being a prescribed multiple of a length of time corresponding to a phase interval between adjacent clocks of the group of second clocks, and generating a timing signal based upon the plurality of signals to which the delay has been added to output the generated timing signal.

2. The circuit according to claim 1, wherein a delay time of the timing signal from the effective edge of the first clock signal at the time when the activate signal is activated to an effective edge of the timing signal, is specified by the sum of m·T1 and n·(T2/L), where T1 is the first period, T2 is the second period, L is a prescribed positive integer indicating the number of phase clocks of the group of second clocks, the phase between adjacent clock signals of the group of second clocks being T2/L, and m and n are non-negative integers specified by the selection signal.

3. The circuit according to claim 1, wherein the digital delay circuit includes:

a coarse delay circuit that generates a coarse timing signal delayed by m·T1, where T1 is the first period and m is a non-negative integer specified by the selection signal, from the effective edge of the first clock at the time when the activate signal is activated; and a fine delay circuit that samples the coarse timing signal in response to respective ones of the group of second clocks to produce a plurality of signals, the group of second clocks comprising L-number of second clocks having the second period with phases spaced apart from each other by T2/L, where T2 is the second period and L is a prescribed integer equal to or greater than 2, adds a delay n·(T2/L) to respective ones of the plurality of signals, where n is a non-negative integer specified by the selection signal, and outputs a fine timing signal at a timing delayed by n·(T2/L) from an effective edge of the coarse timing signal, based upon result of a logical operation performed on the plurality of signals to which the delay has been added.

4. The circuit according to claim 2, wherein m and n are recorded in a register so as to be capable of being varied.

5. A timing control circuit comprising:

a coarse delay circuit that receives a first clock signal having a first period, an activate signal and a first selection signal from a coarse-adjustment register and generates a coarse timing signal with a delay amount m·T1, where T1 is the first period and m is a non-negative integer specified by the first selection signal, from an effective edge of the first clock signal at the time when the activate signal is activated; and a fine delay circuit that receives a group of second clocks comprising L-number of second clock signals having a second period with phases spaced apart from each other by T2/L, where T2 is the second period and L is a prescribed integer equal to or greater than 2, the coarse timing signal output from the coarse delay circuit, and a second selection signal from a fine-adjustment register, samples the coarse timing signal at timings of respective ones of the group of second clocks to produce a plurality of signals, adds a delay n·(T2/L), where n is a non-negative integer specified by the second selection signal, to respective ones of the plurality of signals, and outputs a fine timing signal at a timing delayed by n·(T2/L) from an effective edge of the coarse timing signal, based upon result of a logical operation performed on the plurality of signals to which the delay has been added.

6. The circuit according to claim 5, wherein the coarse delay circuit comprises:

a shift register that transfers a fixed value successively in response to a shift clock supplied thereto;

a gate circuit that receives the first clock signal and the activate signal, transmits and outputs the first clock signal when the activate signal is in an activated state, and masks the first clock signal when the activate signal is in a deactivated state, a clock signal output from the gate circuit being used as the shift clock of the shift register; and a plurality of switches that are provided in correspondence with the first selection signal from the coarse-adjustment register and have input ends to which the clock signal from the gate circuit is applied in common and output ends connected in common to a node, wherein from among the plurality of the switches, a switch selected in correspondence with the value m of the first selection signal from the coarse-adjustment register is turned on, based upon the output of the shift register, at the time when the fixed value has been shifted to an mth stage of the shift register, the mth stage corresponding to the first selection signal; and m cycles, where m is specified by the first selection signal, after the effective edge of the first clock signal at the time when at which the activate signal is activated, the clock signal from the gate circuit is output to the node and the coarse timing signal is output.

7. The circuit according to claim 6, wherein the coarse delay circuit comprises:

a circuit which, when the first selection signal is activated, sets a switch corresponding to the first selection signal from the OFF to the ON state, based upon the output of the shift register, at the moment the fixed value has been shifted to an mth stage of the shift register that corresponds to value m of the first selection signal, and sets the switch from the ON to the OFF state at the moment the fixed value is shifted to an (m+1)th stage in the shift register, and when the first selection signal is in a deactivated state, turns the switch OFF.

8. The circuit according to claim 6, wherein the coarse delay circuit comprises:

a buffer circuit that buffers the signal at the node to which the output ends of the plurality of the switches are connected in common and outputs the coarse timing signal, the buffer circuit including:

an inverting circuit that receives the signal at the node; and a switch which, when the output of the inverting circuit is a first logic value, connects the node to a terminal having a potential corresponding to a second logic value.

9. The circuit according to claim 6, wherein in the coarse delay circuit, a clock that is the inverse of the clock signal output from the gate circuit is used as the shift clock.

10. The circuit according to claim 5, wherein the fine delay circuit comprises:

a plurality of flip-flops that have data terminals for receiving the coarse timing signal from the coarse delay circuit, samples and outputs the coarse timing signal in response to each of the second clocks of the group of second clocks;

a plurality of multiphase clock control delay circuits that receive respective ones of output signals of the plurality of flip-flops and delay and output the signals received by n·(T2/L), with transition timings of clocks supplied to clock terminals of the corresponding flip-flops serving as a reference; and a delay calculating circuit that receives the second selection signal and generates a signal for producing a delay that is n times (T2/L) in each of the plurality of multiphase clock control delay circuits;

wherein the logical sum of outputs of the plurality of the multiphase clock control delay circuits is taken and the fine timing signal, whose effective edge is delayed by n·(T2/L) from the effective edge of the coarse timing signal, is output.

11. The circuit according to claim 10, wherein in the fine delay circuit, each multiphase clock control delay circuit includes:

plural stages of flip-flops in which an output of the flip-flop having an output connected to the input of the multiphase clock control delay circuit is received by an initial stage and the output of a preceding stage is connected to the input of the succeeding stage;

selectors of a first group, which are provided in correspondence with respective ones of the flip-flops of the plurality of stages and receive the group of second clocks, each selector of a first group selecting based upon a clock-input selection signal from the delay calculating circuit, a clock supplied to clock input terminal of the corresponding flip-flop; and a second selector, which receives outputs of the flip-flops of the plurality of stages, and selects and outputs one output based upon a node selection signal from the delay calculating circuit;

wherein values of the clock-input selection signal in the selectors of the first group and of the node selection signal in the second selector are determined in the delay calculating circuit in such a manner that n·(T2/L) will be the delay from a timing that corresponds to a transition of the clock supplied to the flip-flop whose output is connected to the input of the multiphase clock delay circuit, until the selection is made by the second selector.

12. The circuit according to claim 10, wherein L-number of the multiphase clock control delay circuits are disposed in parallel, the number L being equal to the number of phases of the group of second clocks of L phases.

13. A semiconductor storage device including the timing control circuit set forth in claim 1, the timing control circuit controlling timing within a chip.

14. The device according to claim 13, wherein the semiconductor storage device is a DRAM (Dynamic Random-Access Memory), and timing generated by the timing control circuit is used for at least one among bit-line de-equalization, word-line activation, sense-amplifier activation, column-select line activation and main-amplifier activation.

15. A semiconductor storage device including the timing control circuit set forth in claim 5, the timing control circuit controlling timing within a chip.

16. A timing generating method comprising:

responsive to a first clock signal having a first period, an activate signal and a first selection signal, generating a coarse timing signal with a delay amount m·T1, where T1 is the first period and m is a non-negative integer specified by the first selection signal, from an effective edge of the first clock signal at the time when the activate signal is activated; and responsive to a group of second clocks comprising L-number of second clock signals having a second period with phases spaced apart from each other by T2/L, where T2 is the second period and L is a prescribed integer equal to or greater than 2, the coarse timing signal output, and a second selection signal, sampling the coarse timing signal at timings of respective ones of the group of second clocks to produce a plurality of signals, adding a delay n·(T2/L), where n is a non-negative integer specified by the second selection signal, to respective ones of the plurality of signals, and outputting a fine timing signal at a timing delayed by n·(T2/L) from an effective edge of the coarse timing signal, based upon result of a logical operation performed on the plurality of signals to which the delay has been added.

\* \* \* \* \*